(12) United States Patent
Kondo

(10) Patent No.: US 8,576,211 B2
(45) Date of Patent: Nov. 5, 2013

(54) ELECTRONIC ELEMENT, CURRENT CONTROL DEVICE, ARITHMETIC DEVICE, AND DISPLAY DEVICE

(75) Inventor: Hiroshi Kondo, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 912 days.

(21) Appl. No.: 12/160,814

(22) PCT Filed: Dec. 27, 2006

(86) PCT No.: PCT/JP2006/326392
§ 371 (c)(1),
(2), (4) Date: Jul. 14, 2008

(87) PCT Pub. No.: WO2007/086237
PCT Pub. Date: Aug. 2, 2007

(65) Prior Publication Data
US 2010/0164918 A1 Jul. 1, 2010

(30) Foreign Application Priority Data

Jan. 24, 2006 (JP) ................. 2006-014996
May 11, 2006 (JP) ................. 2006-132706
Aug. 3, 2006 (JP) ................. 2006-212249

(51) Int. Cl.
*G09G 5/00* (2006.01)
(52) U.S. Cl.
USPC .............. 345/206; 345/77; 345/211; 257/40
(58) Field of Classification Search
USPC ................. 345/76, 206, 211; 257/40
See application file for complete search history.

(56) References Cited

U.S. PATENT DOCUMENTS

| 7,119,366 B2 | 10/2006 | Kondoh |
| 7,126,153 B2 | 10/2006 | Iechi et al. |
| 2002/0030436 A1* | 3/2002 | Ichikawa ............... 313/495 |
| 2003/0213952 A1 | 11/2003 | Iechi et al. |

(Continued)

FOREIGN PATENT DOCUMENTS

| CN | 1268730 A | 10/2000 |
| EP | 1 367 659 A2 | 12/2003 |

(Continued)

OTHER PUBLICATIONS

Extended Search Report issued Mar. 9, 2011, in European Patent Application No. 06 84 3761.5-1235 / 1974390.

(Continued)

*Primary Examiner* — Amare Mengistu
*Assistant Examiner* — Premal Patel
(74) *Attorney, Agent, or Firm* — Oblon, Spivak, McClelland, Maier & Neustadt, L.L.P.

(57) ABSTRACT

A disclosed electronic element includes: a substrate; a first electrode layer formed on a portion of the substrate; an insulating layer formed on the first electrode layer; a conductive layer formed on the insulating layer formed on an area where the first electrode layer is formed; a second electrode layer formed on one area where the first electrode layer on the substrate is not formed; a third electrode layer formed on the other area where neither the first electrode layer on the substrate nor the second electrode layer is formed; and a semiconductor layer formed so as to cover between the conductive layer and the second electrode layer and to cover between the conductive layer and the third electrode layer.

11 Claims, 19 Drawing Sheets

(56) References Cited

U.S. PATENT DOCUMENTS

| | | | |
|---|---|---|---|
| 2003/0218166 A1* | 11/2003 | Tsutsui | 257/40 |
| 2004/0061141 A1 | 4/2004 | Kondoh | |
| 2004/0238816 A1 | 12/2004 | Tano et al. | |
| 2005/0012736 A1* | 1/2005 | Uchino et al. | 345/211 |
| 2005/0030264 A1* | 2/2005 | Tsuge et al. | 345/76 |
| 2006/0124925 A1 | 6/2006 | Kondo et al. | |
| 2006/0170836 A1 | 8/2006 | Kondo et al. | |
| 2008/0283825 A1 | 11/2008 | Chua et al. | |

FOREIGN PATENT DOCUMENTS

| | | |
|---|---|---|
| JP | 11 193345 | 7/1999 |
| JP | 11 193346 | 7/1999 |
| JP | 11 193347 | 7/1999 |
| JP | 2002 162630 | 6/2002 |
| JP | 2003 96034 | 4/2003 |
| JP | 2003 110110 | 4/2003 |
| JP | 2003 267982 | 9/2003 |
| JP | 2004 111872 | 4/2004 |
| JP | 2004 349292 | 12/2004 |
| JP | 2005 19446 | 1/2005 |
| JP | 2005 56871 | 3/2005 |
| JP | 2005-203728 A | 7/2005 |
| JP | 2005 268607 | 9/2005 |
| JP | 2005 268618 | 9/2005 |
| JP | 2005 310962 | 11/2005 |
| JP | 2005 534190 | 11/2005 |
| JP | 2005 354013 | 12/2005 |
| WO | 2005 020342 | 3/2005 |
| WO | WO 2005/098959 A2 | 10/2005 |

OTHER PUBLICATIONS

Bao, Zhenan et. al., "Soluble and processable regioregular poly(3-hexylthiophene) for thin film field-effect transistor applications with high mobility", Applied Physics Letters, vol. 69, No. 26, pp. 4108-4110, (1996).

Collet, J. et. al., "Low-voltage, 30 nm channel length, organic transistors with a self-assembled monolayer as gate insulating films", Applied Physics Letters, vol. 76, No. 14, pp. 1941-1943, (2000).

"Analog Electrical Technology Basis" Textbook Series for 21$^{st}$ Century, Higher Education Press, 2001, 8 pages.

Office Action issued Sep. 18, 2012 in Japanese Patent Application No. 2007-011720.

* cited by examiner

ELECTRONIC ELEMENT, CURRENT CONTROL DEVICE, ARITHMETIC DEVICE, AND DISPLAY DEVICE

TECHNICAL FIELD

The present invention relates to an electronic element, a current control device, an arithmetic device, and a display device.

BACKGROUND ART

Today, typical display devices used for information display and the like include CRTs, liquid crystal display devices, and EL display devices. Conventionally, CRTs have been widely used as display devices in terms of relatively low device cost and high display quality. However, it is difficult to miniaturize Braun tubes and achieve low power consumption. In view of this, there has been an increasing demand for liquid crystal display devices and EL display devices recently. Further, IC tags capable of reading and writing data in a non-contact manner are expected to create a large market in the use of distribution and personal information management. Such IC tags include a large number of arithmetic devices embedded therein.

On the other hand, general active elements used for display devices and arithmetic devices are made of transistors having a semiconductor material, a first electrode (gate electrode 100), a second electrode (source electrode 101), and a third electrode (drain electrode 102). Examples of a general structure of a transistor include a planar type (refer to FIG. 21-(a)) and an inverse stagger type (refer to FIG. 21-(b)).

Regarding semiconductor materials, in recent years, organic semiconductor materials to which a coating process can be applied have been actively developed. Organic semiconductor devices that can be manufactured through coating require no vacuum film forming process, so that it is possible to substantially reduce a manufacturing cost.

In recent years, polythiophene materials have attracted attention as organic semiconductor materials with large mobility, to which the coating process can be applied (refer to Non-patent Document 1). However, the mobility is less than 0.1 $cm^2/V \cdot s$ and is about ten times smaller in comparison with mobility of amorphous silicon. In accordance with this, in general, transistors in which organic semiconductor materials are used have kHz order of cutoff frequency as an index of high speed responsiveness. Thus, it is impossible to use such transistors for driving high-definition movie display devices that require not less than several MHz order of cutoff frequency or for IC tags.

In addition to an increase of the mobility of organic semiconductor materials, a reduction of a channel length 104 of a transistor may be employed as a way of improving the cutoff frequency. However, in order to perform patterning on the source electrode 101 and the drain electrode 102 in a channel length of about 1 µm or less, complicated steps and expensive manufacturing apparatus are necessary in general, so that this is problematic in that the manufacturing cost is increased.

In order to solve such problems, a SIT structure (refer to FIG. 22-(a)) is known in which the source electrode 101, the gate electrode 100, and the drain electrode 102 are successively laminated. In the SIT structure, a current between the source electrode 101 and the drain electrode 102 is ON/OFF through control as shown in FIG. 22-(b), in which by applying a gate voltage 6, depletion layers 107 in a semiconductor layer 105 are increased and resistance between the source electrode 101 and the drain electrode 102 is increased.

As understood from FIG. 22-(a), it is possible to control the channel length 109 of the SIT structure in accordance with a film thickness of the semiconductor layer 105. A manufacturing process of the SIT structure is very easy in terms of a reduced channel length, so that the SIT structure is expected to be a transistor with high speed responsiveness. However, the SIT structure is problematic in that the depletion layers 107 are not spread in an entire area in a direction 108 of a channel width thereof when a space between the gate electrodes 100 is increased and the current is increased when the current is OFF. In view of this, it is necessary to perform patterning such that the space between the gate electrodes 100 is less than 1 µm, so that complicated steps are necessary for the manufacturing process.

Further, a parasitic capacity in an inside of an element must be reduced in order to improve the cutoff frequency.

For example, in the case of FIG. 21-(a), the parasitic capacity is formed by holding a gate insulating film 103 between the gate electrode 100 and the source electrode 101 and between the gate electrode 100 and the drain electrode 102. If the parasitic capacity is large, portions irrelevant to circuit operations are charged by the application of the gate voltage, so that high-speed response is difficult. Moreover, if the gate voltage has a high frequency, impedance of a capacitor is substantially small, so that the gate voltage is flown to the source electrode 101 and the drain electrode 102. As a result, power consumption of the element becomes vary large, and it is difficult to apply the element to an application in which a battery is used for driving as in mobile use, for example.

In accordance with this, in the planar type, it is necessary to align the gate electrode 100, the source electrode 101, and the drain electrode 102 such that they are hardly overlapped with one another. In particular, when a material of the substrate is subject to shrinkage such as a resin film, the alignment becomes more difficult as an area is increased.

In the SIT structure, the parasitic capacity is formed by holding the semiconductor layer 105 using the gate electrode 100, the source electrode 101, and the drain electrode 102 in the same manner as shown in FIG. 22-(a), so that failure may be generated in performing high-speed operations or achieving low power consumption. Moreover, it is very difficult to align the source electrode 101 and drain electrode 102 such that they are not overlapped with the microfabricated gate element.

In view of this, Patent Document 1 discloses a field-effect transistor including: a first electrode formed on a substrate and having a convex portion; an insulating layer covering the first electrode; a second electrode formed on the insulating layer and positioned above the convex portion of the first electrode; a third electrode disposed on at least one of both sides of the convex portion of the first electrode via the insulating layer and positioned lower than the convex portion of the first electrode; and a semiconductor layer in contact with the second electrode and the third electrode while being separated from the first electrode using the insulating layer.

In addition, Patent Document 2 discloses a field-effect transistor including: (A) a gate electrode formed on a substrate and having a top face, a first side and a second side where a form of a cross-section is substantially a quadrangular shape; (B) an insulating film formed on the top face, the first side, and the second side of the gate electrode; (C) a first source/drain electrode formed on a portion of the insulating film positioned on the top face of the gate electrode; (D) a second source/drain electrode formed on a portion of the substrate facing the first side of the gate electrode; (E) a third source/drain electrode formed on a portion of the substrate facing the second side of the gate electrode; and (F) a semiconductor material layer formed from the second source/drain electrode to the third source/drain electrode via the first source/drain electrode. In the field-effect transistor, a first field-effect transistor is constructed with the gate electrode, the first source/drain electrode, a first channel forming area made of a portion of the semiconductor material layer formed on the portion of the insulating layer positioned on the first side of the gate electrode, and the second source/drain electrode and a second field-effect transistor is constructed with the gate electrode, the first source/drain electrode, a second channel forming area made of a portion of the semiconductor material layer formed on the portion of the insulating layer positioned on the second side of the gate electrode, and the third source/drain electrode.

However, in the above-mentioned structures, the parasitic capacity is formed between the gate electrode and the source electrode or the drain electrode, so that high-speed response is difficult.

Patent Document 1: Japanese Laid-Open Patent Application No. 2005-19446

Patent Document 2: Japanese Laid-Open Patent Application No. 2004-349292

Non-patent Document 1: Applied Physics Letter, vol. 69, pp. 4108 (1996)

DISCLOSURE OF INVENTION

It is a general object of the present invention to provide an improved and useful electronic element, current control device, arithmetic device, and display device in which the above-mentioned problems are eliminated.

A more specific object of the present invention is to provide an electronic element capable of high-speed response, a current control device having the electronic element, and an arithmetic device and a display device having the electronic element or the current control device.

According to one aspect of the present invention, there is provided an electronic element comprising: a substrate; a first electrode layer formed on a portion of the substrate; an insulating layer formed at least on the first electrode layer; a conductive layer formed on the insulating layer formed on an area where the first electrode layer is formed; a second electrode layer formed on one area where the first electrode layer on the substrate is not formed; a third electrode layer formed on the other area where neither the first electrode layer on the substrate nor the second electrode layer is formed; and a semiconductor layer formed so as to cover between the conductive layer and the second electrode layer and to cover between the conductive layer and the third electrode layer. Thus, it is possible to provide an electronic element capable of high-speed response.

According to another aspect of the present invention, in the above-mentioned electronic element, the second electrode layer, the third electrode layer, and the conductive layer are made of the same material. Thus, it is possible to readily manufacture an electronic element.

According to another aspect of the present invention, in the above-mentioned electronic element, at least one of the semiconductor layer, the insulating layer, the first electrode layer, the second electrode layer, the third electrode layer, and the conductive layer is formed by coating. Thus, it is possible to reduce a manufacturing cost.

According to another aspect of the present invention, in the above-mentioned electronic element, the insulating layer is formed using a dipping method. Thus, it is possible to form an insulating layer with little unevenness in a film thickness.

According to another aspect of the present invention, in the above-mentioned electronic element, the insulating layer is made of an insulating material whose critical surface tension is changed when energy is applied thereto, and at least one of the second electrode layer, the third electrode layer, and the conductive layer is formed by coating. Thus, it is possible to perform high resolution patterning on an insulating layer.

According to another aspect of the present invention, in the above-mentioned electronic element, at least one of the second electrode layer, the third electrode layer, and the conductive layer is made of more than one type of materials, and a component ratio of more than one type of materials is changed in a direction of film thickness. Thus, it is possible to readily control work function of a second electrode layer, a third electrode layer, and a conductive layer.

According to another aspect of the present invention, in the above-mentioned electronic element, a surface of at least one of the second electrode layer, the third electrode layer, and the conductive layer is electrolytically plated. Thus, it is possible to obtain an electronic element in which a conductive material is selectively formed on at least one of a second electrode layer, a third electrode layer, and a conductive layer.

According to another aspect of the present invention, there is provided a current control device comprising: the above-mentioned electronic element; and a current control unit using a first voltage control device for applying a voltage to a first electrode layer and a second voltage control device for applying a voltage to a second electrode layer and a third electrode layer such that a current between the second electrode layer and the third electrode layer is controlled. Thus, it is possible to provide a current control device capable of high-speed response.

According to another aspect of the present invention, in the above-mentioned current control device, the current control unit is formed on the substrate. Thus, it is possible to provide a current control device capable of high-speed response.

According to another aspect of the present invention, there is provided an arithmetic device having the above-mentioned electronic element or the above-mentioned current control device. Thus, it is possible to provide an arithmetic device capable of high-speed response.

According to another aspect of the present invention, there is provided a display device for performing display in accordance with a change of voltage between electrodes formed on one of two substrates disposed in an opposing manner, in which the above-mentioned current control device is used for pixel switching. Thus, it is possible to provide a display device capable of high-speed response.

According to another aspect of the present invention, there is provided a display device for performing display in accordance with a change of current between electrodes formed on one of two substrates disposed in an opposing manner, in which the above-mentioned current control device is used for pixel switching or pixel driving. Thus, it is possible to provide a display device capable of high-speed response.

According to the present invention, it is possible to provide an electronic element capable of high-speed response, a current control device having the electronic element, an arithmetic device, and a display device having the electronic element or the current control device.

Other objects, features and advantage of the present invention will become more apparent from the following detailed description when read in conjunction with the accompanying drawings.

BEST MODE FOR CARRYING OUT THE INVENTION

In the following, embodiments of the present invention are described with reference to the drawings.

Figure 1:
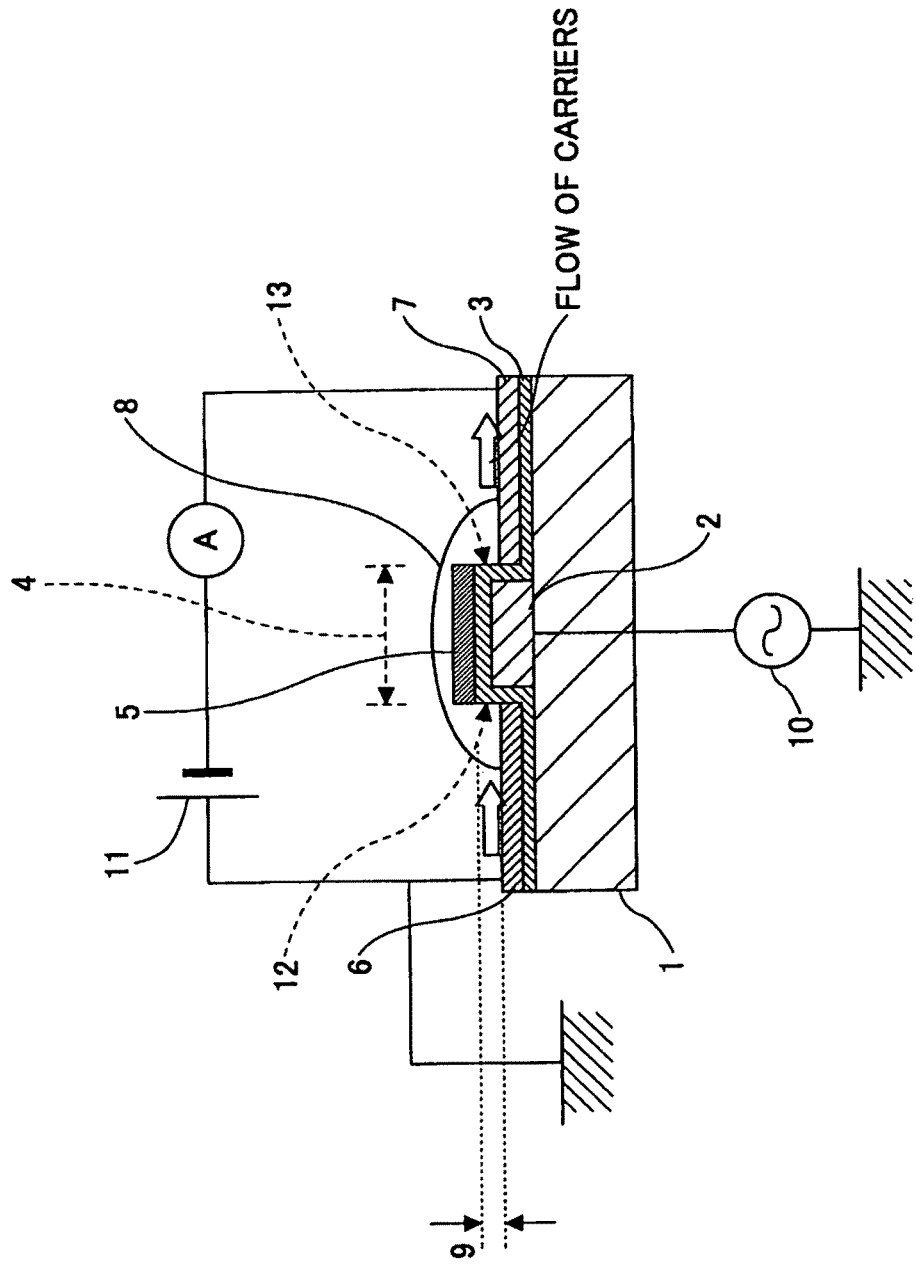
FIG. 1 is a schematic diagram showing an example of a structure of an electronic element and a current control device according to the present invention.

As shown in FIG. 1, an electronic element according to the present invention includes: a substrate 1; a first electrode layer 2 formed on a portion of the substrate 1; an insulating layer 3 formed on the first electrode layer 2; a conductive layer 5 formed on the insulating layer 3 formed on an area 4 where the first electrode layer 2 is formed; a second electrode layer 6 formed on one area where the first electrode layer 2 on the substrate 1 is not formed; a third electrode layer 7 formed on the other area where neither the first electrode layer 2 on the substrate 1 nor the second electrode layer 6 is formed; and a semiconductor layer 8 formed so as to cover between the conductive layer 5 and the second electrode layer 6 and to cover between the conductive layer 5 and the third electrode layer 7. In the present invention, the area 4 where the first electrode layer 2 is formed refers to an area including the first electrode layer 2 and a vicinity of the first electrode layer 2 as shown in FIG. 1. The areas where the first electrode layer 2 on the substrate 1 is not formed indicate areas except the area 4 where the first electrode layer 2 on the substrate 1 is formed (the area including the first electrode layer 2 and the vicinity of the first electrode layer 2). In this case, the conductive layer 5 is not in contact with the second electrode layer 6 or the third electrode layer 7. Further, distances (channel length 9) between the conductive layer 5 and the second electrode layer 6 and the third electrode layer 7 are defined by at least a thickness of the first electrode layer 2. Thus, it is readily possible to reduce the channel length 9.

As shown in FIG. 1, a current control device according to the present invention includes the electronic element of the present invention and a current control unit controlling a current between the second electrode layer 6 and the third electrode layer 7 using a first voltage control device 10 applying a voltage to the first electrode layer 2 and a second voltage control device 11 applying a voltage to the second electrode layer 6 and the third electrode layer 7. In this case, the current control unit is preferably formed on the substrate 1.

Regarding a cutoff frequency $f_c$, Applied Physics Letter, vol. 76, No. 14, April 3 (2000), pp. 1941-1943, reports that formula (1): $f_c = \mu V_{ds}/2\pi L^2$ is in good correspondence to an experimental value. In this case, μ indicates carrier mobility, $V_{ds}$ indicates a source-drain voltage 52, and L indicates a channel length. In accordance with this, when the parasitic capacity is negligibly small, high-speed response is possible by reducing the channel length.

In the electronic element of the present invention, the first electrode layer 2, the second electrode layer 6, and the third electrode layer 7 are self-aligned such that they are not likely to be overlapped. Thus, it is easy to reduce the parasitic capacity. Although the parasitic capacity is formed between the first electrode layer 2 and the conductive layer 5, a voltage is applied between the first electrode layer 2 and the second electrode layer 6 and the third electrode layer 7, so that the parasitic capacity is charged via the semiconductor layer 8. In this case, resistance of the semiconductor layer 8 is very high even when the current is ON in comparison with wiring resistance. Accordingly, even when the parasitic capacity is apparently formed, the charging is hardly carried out between the first electrode layer 2 and the conductive layer 5 by applying a voltage to the first electrode layer 2. Thus, it is possible to practically reduce the parasitic capacity and achieve high-speed response. Further, even when the voltage to be applied to the first electrode layer 2 has a high frequency, a gate current is seldom flown to the second electrode layer 6 or the third electrode layer 7 due to the resistance of the semiconductor layer 8, so that it is possible to achieve low power consumption.

As shown in FIG. 1, in the current control device according to the present invention, when the first voltage control device 10 applies a voltage to the first electrode layer 2, a channel is formed between the first electrode layer 2 and the conductive layer 5 and between the conductive layer 5 and the third electrode layer 7. In this case, when the second voltage control device 11 applies a voltage between the second electrode layer 6 and the third electrode layer 7, carriers move from the second electrode layer 6 and enter the conductive layer 5 through the semiconductor layer 8 and the carries are injected from the conductive layer 5 to the semiconductor layer $ and flown to the third electrode layer 7.

In the present invention, the first electrode layer 2, the second electrode layer 6, the third electrode layer 7, and the conductive layer 5 may be made of conductive materials including metals such as chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), tin (Sn), and the like, alloys such as ITO, IZO, and the like, polyacetylene conductive polymers, polyphenylene conductive polymers such as poly(p-phenylene), poly(p-phenylene) derivatives, polyphenylene vinylene, polyphenylene vinylene derivatives, and the like, heterocyclic conductive polymers such as polypyrrole, polypyrrole derivatives, polythiophene, polythiophene derivatives, polyfuran, polyfuran derivatives, and the like, and ionic conductive polymers such as polyaniline, polyaniline derivatives, and the like. In addition, it is also possible to use these metals, alloys, conductive polymers in combination.

Further, the conductive polymers may be used while conductivity thereof is increased by doping a dopant. Examples of compounds with a low vapor pressure preferably used as dopant include polysulfonic acid, polystyrenesulfonic acid, naphthalenesulfonic acid, alkylnaphthalenesulfonic acid, and the like.

In the present invention, volume resistivity of the first electrode layer 2, the second electrode layer 6, the third electrode layer 7, and the conductive layer 5 is usually not more than $1\times10^{-3} \Omega\cdot cm$ and is preferably not more than $1\times10^{-6}\Omega\cdot cm$.

In the present invention, examples of materials of the semiconductor layer 8 include organic semiconductor materials such as fluorene, fluorene derivatives, fluorenone, fluorenone derivatives, poly(N-vinylcarbazole) derivatives, polyglutamic acid γ-carbazolyl ethyl derivatives, polyvinyl phenanthrene derivatives, polysilane derivatives, oxazole derivatives, oxadiazole derivatives, imidazole derivatives, arylamine derivatives such as monoarylamine, triarylamine derivatives, and the like, benzidine derivatives, diarylmethane derivatives, triarylmethane derivatives, styrylanthracene derivatives, pyrazoline derivatives, divinylbenzene derivatives, hydrazone derivatives, indene derivatives, indenone derivatives, butadiene derivatives, pyrene derivatives such as pyrene-formaldehyde, polyvinylpyrene, and the like, stilbene derivatives such as α-phenylstilbene derivatives, bis-stilbene derivatives, and the like, enamine derivatives, thiophene derivatives such as polyalkyl thiophene and the like, pentacene, tetracene, bisazo, trisazo dye, polyazo dye, triarylmethane dye, thiazine dye, oxazine dye, xanthene dye, cyanine dye, styryl dye, pyrylium dye, quinacridone dye, indigo dye, perylene dye, polycyclic quinine dye, bisbenzimidazole dye, indanthrone dye, squarylium dye, anthraquinone dye, and phthalocyanine dye such as copper phthalocyanine, titanyl phthalocyanine, and the like, inorganic semiconductor materials such as CdS, ZnO, PbTe, PbSnTe, InGaZnO, GaP, GaAlAs, GaN, and the like, and silicone semiconductor materials such as polysilicon, amorphous silicon, and the like. Preferably, amorphous silicon is used in order to reduce the cost using other than coatable materials. The amorphous silicon is also preferable in terms of durability of TFT and stability of operation.

In the present invention, examples of materials of the insulating layer 3 include inorganic insulating materials such as $SiO_2$, $Ta_2O_5$, $Al_2O_3$, and the like, and organic insulating materials such as polyimide, styrene resin, polyethylene resin, polypropylene, vinyl chloride resin, polyester alkyd resin, polyamide, polyurethane, polycarbonate, polyalylate, polysulfone, diallyl phthalate resin, polyvinyl butyral resin, polyether resin, polyester resin, acrylic resin, silicone resin, epoxy resin, phenolic resin, urea resin, melamine resin, fluorine resin such as PFA, PTFE, PVDF, and the like, parylene resin, photo-curing resin such as epoxy acrylate, urethane-acrylate, and the like, and polysaccharides such as pullulan, cellulose, and the like, and derivatives thereof.

In the present invention, volume resistivity of the insulating layer 3 is preferably not less than $1\times10^{13}\Omega\cdot cm$ and is more preferably not less than $1\times10^{14}\Omega\cdot cm$.

In the present invention, the insulating layer 3 may be formed by a thermal oxidation method, an anodic oxidation method, a vacuum film formation process such as deposition, spattering, CVD, and the like, a printing method using a relief printing plate, flexographic printing, a printing method using a stencil printing plate, screen printing, a printing method using a planographic plate, offset printing, a printing method using an intaglio plate, gravure printing, and a printing method such as a spin coat method, a dipping method, a spray coat method, an ink-jet method, and the like. Preferably, the anodic oxidation method is used in terms of simplicity of a processing device when oxides of the materials for forming the first electrode layer 2 are used as insulating materials.

In the present invention, examples of materials of the substrate 1 include glass, metallic materials with the above-mentioned insulating material coated on a surface thereof, the above-Mentioned organic insulating material formed as a film, and the like.

In the present invention, it is possible to specifically determine positions of the second electrode layer 6, the third electrode layer 7, and the conductive layer 5 relative to the area 4 where the first electrode layer 2 is formed. Thus, alignment is easy and it is possible to reduce the manufacturing cost. In addition, the second electrode layer 6, the third electrode layer 7, and the conductive layer 5 may be formed through separate processes or may be formed at the same time. When the conductive materials are attached to a channel portion after the second electrode layer 6, the third electrode layer 7, and the conductive layer 5 are formed, the layers may be dipped into a liquid for dissolving the conductive materials.

Figure 2:
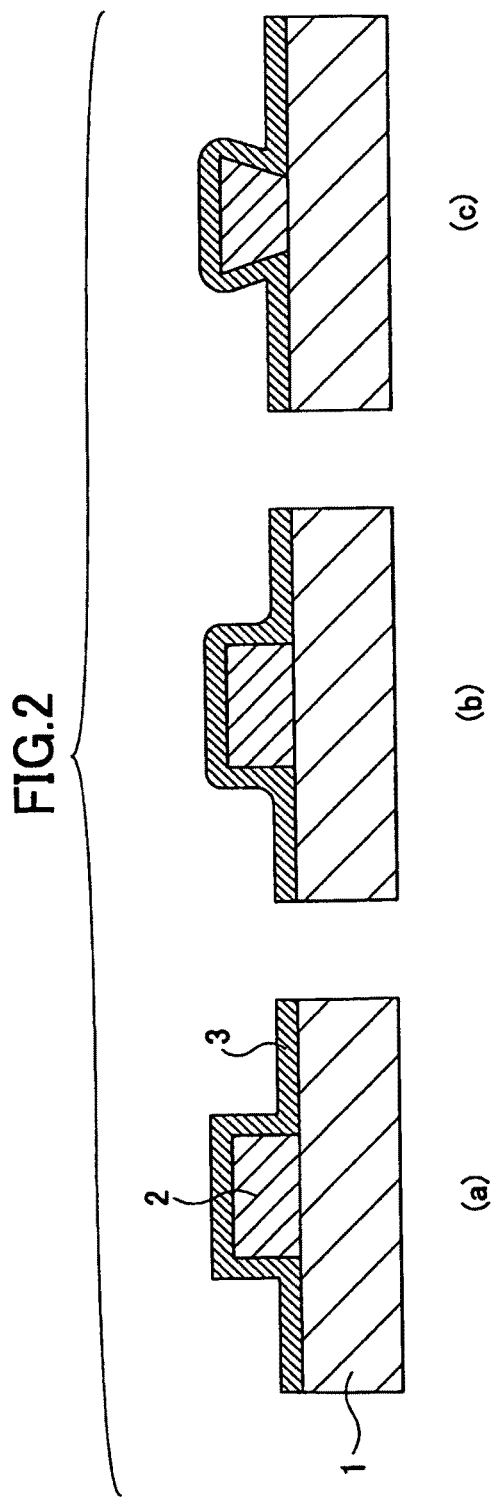
FIG. 2 is a cross-sectional view showing an example of a structure of a first electrode layer and an insulating layer.

In the present invention, the first electrode layer 2 and the insulating layer 3 preferably have a convex portion forming an angle of not less than 60° relative to a surface of the substrate 1. Further preferably, the angle is not less than 80° and specifically preferably, the angle is not less than 90°. In accordance with this, it is readily possible to define a distance (channel length 9) between the second electrode layer 6 and the third electrode layer 7 and the conductive layer 5. FIG. 2-(*a*) shows the first electrode layer 2 and the insulating layer 3 having a convex portion forming an angle of 90° relative to the surface of the substrate 1. Further, as shown in FIG. 2-(*b*), a portion of the insulating layer 3 may have a convex portion forming an angle of 90° relative to the surface of the substrate 1. In addition, FIG. 2-(*c*) shows the first electrode layer 2 and the insulating layer 3 having a convex portion forming an angle of more than 90° relative to the surface of the substrate 1.

Figure 19:
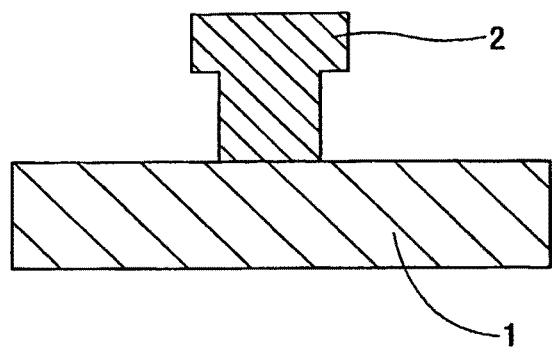
FIG. 19 is a cross-sectional view showing an example of a structure of a first electrode layer.
Figure 20:
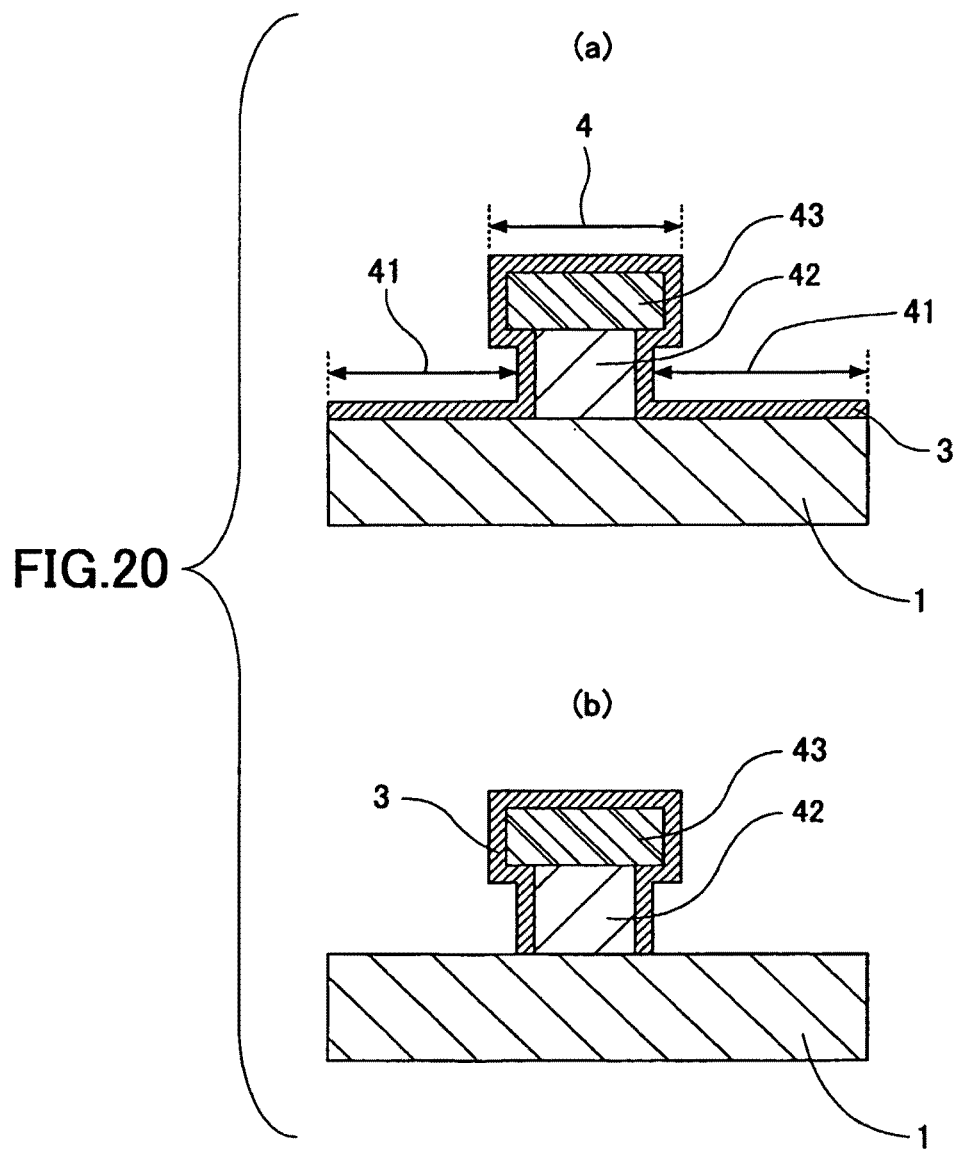
FIG. 20 is a diagram showing a method for forming the first electrode layer and an insulating layer.

Moreover, as shown in FIG. 19, the first electrode layer 2 may have an overhang structure. In this case, as shown in FIG. 20, the first electrode layer 2 is formed by laminating a conductive material B 42 and a conductive material A 43 successively and then performing etching. The insulating layer 3 may be formed at least on the first electrode layer 2 using the CVD method (refer to FIG. 20-(*a*)), the anodic oxidation method, or the thermal oxidation method (refer to FIG. 20-(*b*)). A Specific example of etching processing is described in the following. First, resist is formed by performing patterning on the conductive material A 43, a resultant substance is dipped into a liquid for dissolving the conductive material A 43, and the conductive material A 43 is subjected to patterning. Next, an obtained substance is dipped into a liquid for dissolving the conductive material B 42 and the conductive material B 42 is subjected to patterning. In this case, the overhang structure is formed by performing overetching on the conductive material B 42.

In the electronic element according to the present invention, preferably, the second electrode layer 6, the third electrode layer 7, and the conductive layer 5 are made of the same material. In accordance with this, it is possible to manufacture the second electrode layer 6, the third electrode layer 7, and the conductive layer 5 at the same time, so that it is possible to readily manufacture the electronic element.

In the present invention, the second electrode layer 6, the third electrode layer 7, and the conductive layer 5 may be formed by a vacuum film formation process such as deposition, sputtering, CVD, and the like, and a printing process such as a printing method using a relief printing plate, flexographic printing, a printing method using a stencil printing plate, screen printing, a printing method using a planographic plate, offset printing, a printing method using an intaglio plate, gravure printing, and the like. Preferably, plate printing methods such as the flexographic printing, screen printing, offset printing, gravure printing, and the like are used, since it is readily possible to have a larger area and improve efficiency of forming.

In the electronic element according to the present invention, preferably, at least one of the semiconductor layer 8, the insulating layer 3, the first electrode layer 2, the second electrode layer 6, the third electrode layer 7, and the conductive layer 5 is made of coatable materials. In accordance with this, it is possible to manufacture the electronic element using a printing process and to reduce the manufacturing cost in comparison with a case where a vacuum film formation process such as sputtering or the like is used. Examples of the printing process include a printing method using a relief printing plate, flexographic printing, a printing method using a stencil printing plate, screen printing, a printing method using a planographic plate, offset printing, a printing method using an intaglio plate, gravure printing, a spin coat method, a dipping method, a spray coat method, an ink-jet method, and the like. Preferably, plate printing methods such as the flexographic printing, screen printing, offset printing, gravure printing, and the like are used, since it is readily possible to have a larger area and improve efficiency of forming.

In the present invention, examples of a coating liquid for the first electrode layer 2, the second electrode layer 6, the third electrode layer 7, and the conductive layer 5 include a metal nanoparticle dispersion in which nanoparticles of Ag, Au, and the like are dispersed in a solvent and a solution or a fluid dispersion in which at least one of the following is dispersed or dissolved in a solvent, including polyacetylene conductive polymers, polyphenylene conductive polymers such as poly(p-phenylene), poly(p-phenylene) derivatives, polyphenylene vinylene, polyphenylene vinylene derivatives, and the like, heterocyclic conductive polymers such as polypyrrole, polypyrrole derivatives, polythiophene, polythiophene derivatives, polyfuran, polyfuran derivatives, and the like, and ionic conductive polymers such as polyaniline, polyaniline derivatives, and the like. Further, the conductive polymers may be used while conductivity thereof is increased by doping a dopant. Examples of compounds with a low vapor pressure preferably used as the dopant include polysulfonic acid, polystyrenesulfonic acid, naphthalenesulfonic acid, alkylnaphthalenesulfonic acid, and the like.

In the present invention, examples of a coating liquid for the semiconductor layer 8 include a solution in which at least one of the following is dispersed, including organic semiconductor materials such as fluorene, fluorene derivatives, fluorenone, fluorenone derivatives, poly(N-vinylcarbazole) derivatives, polyglutamic acid γ-carbazolyl ethyl derivatives, polyvinyl phenanthrene derivatives, polysilane derivatives, oxazole derivatives, oxadiazole derivatives, imidazole derivatives, arylamine derivatives such as monoarylamine, triarylamine derivatives, and the like, benzidine derivatives, diarylmethane derivatives, triarylmethane derivatives, styrylanthracene derivatives, pyrazoline derivatives, divinylbenzene derivatives, hydrazone derivatives, indene derivatives, indenone derivatives, butadiene derivatives, pyrene derivatives such as pyrene-formaldehyde, polyvinylpyrene, and the like, stilbene derivatives such as α-phenylstilbene derivatives, bisstilbene derivatives, and the like, enamine derivatives, thiophene derivatives such as polyalkyl thiophene and the like, pentacene, tetracene, bisazo, trisazo dye, polyazo dye, triarylmethane dye, thiazine dye, oxazine dye, xanthene dye, cyanine dye, styryl dye, pyrylium dye, quinacridone dye, indigo dye, perylene dye, polycyclic quinine dye, bisbenzimidazole dye, indanthrone dye, squarylium dye, anthraquinone dye, and phthalocyanine dye such as copper phthalocyanine, titanyl phthalocyanine, and the like, or a fluid dispersion in which the organic semiconductor materials are dispersed in a solution where semiconductor materials and insulating materials are dissolved.

In the present invention, examples of a coating liquid for the insulating layer 3 include a solution, in which the following is dispersed, including organic insulating materials such as polyimide resin, styrene resin, polyethylene resin, polypropylene, vinyl chloride resin, polyester alkyd resin, polyamide, polyurethane, polycarbonate, polyalylate, polysulfone, diallyl phthalate resin, polyvinyl butyral, polyether resin, polyester resin, acrylic resin, silicone resin, epoxy resin, phenolic resin, urea resin, melamine resin, fluorine resin such as PFA, PTFE, PVDF, and the like, parylene resin, photo-curing resin such as epoxy acrylate, urethane-acrylate, and the like, and polysaccharides such as pullulan, cellulose, and the like, and derivatives thereof, or a fluid dispersion in which the organic insulating materials are dispersed in a solution where insulating materials are dissolved.

Further, in the present invention, it is possible to form the insulating layer 3 made of inorganic insulating materials by forming a film of metal-oxide gel through coating and subjecting the metal-oxide gel film to heat treatment. It is possible to form the metal-oxide gel film by hydrolyzing metallic alkoxide represented by a general formula:

$$M(OR)_n \text{ or } MR(OR')_{n-1}$$

The metallic alkoxide is not specifically limited as long as hydrolyzable alkoxide is included. In the formula, M indicates at least divalent metal and R and R' indicate an alkyl group and a phenyl group, respectively. It is possible to use a single type of the metallic alkoxide separately or two types of the metallic alkoxide through mixing. In this case, preferably, the metal M belongs to group IIIb or group IV in the periodic table. Examples of metal in group IIIb include Al and the like and examples of metal in group IV include Ti, Zr in group IVa, Si in group IVb, and the like.

In the present invention, preferably, critical surface tension of the insulating layer 3 is not more than 40 mN/m. In accordance with this, it is possible to increase the mobility of the semiconductor layer 8.

Preferably, critical surface tension of the second electrode layer 6, the third electrode layer 7, and the conductive layer 5 has a small difference from the critical surface tension of the insulating layer 3. Further preferably, the critical surface tension of the second electrode layer 6, the third electrode layer 7, and the conductive layer 5 is the same as that of the insulating layer 3. When there is a large difference between the critical surface tension of the second electrode layer 6, the third electrode layer 7, and the conductive layer 5 and that of the insulating layer 3, the semiconductor layer 8 to be formed thereon is unlikely to become a uniform thin film in some cases.

Preferably, the critical surface tension of the second electrode layer 6, the third electrode layer 7, and the conductive layer 5 is not more than 40 mN/m in the same manner as in the insulating layer 3. In order to achieve this, surface treatment may be performed on the second electrode layer 6, the third electrode layer 7, and the conductive layer 5, using SAM-forming molecular species from those disclosed in Japanese Laid-Open Patent Application No. 2005-534190, the SAM-forming molecular species having water repellent functional groups at least on ends thereof.

It is also possible to perform the surface treatment on the insulating layer 3 using the SAM-forming molecular species disclosed in Japanese Laid-Open Patent Application No. 2005-534190. In accordance with this, it is possible to control the mobility of the semiconductor layer 8 and a threshold voltage upon FET operations.

In the present invention, preferably, the insulating layer 3 is formed using the dipping method. In accordance with this, it is possible to form the insulating layer 3 with little unevenness in the film thickness through a very simple method.

Figure 3:
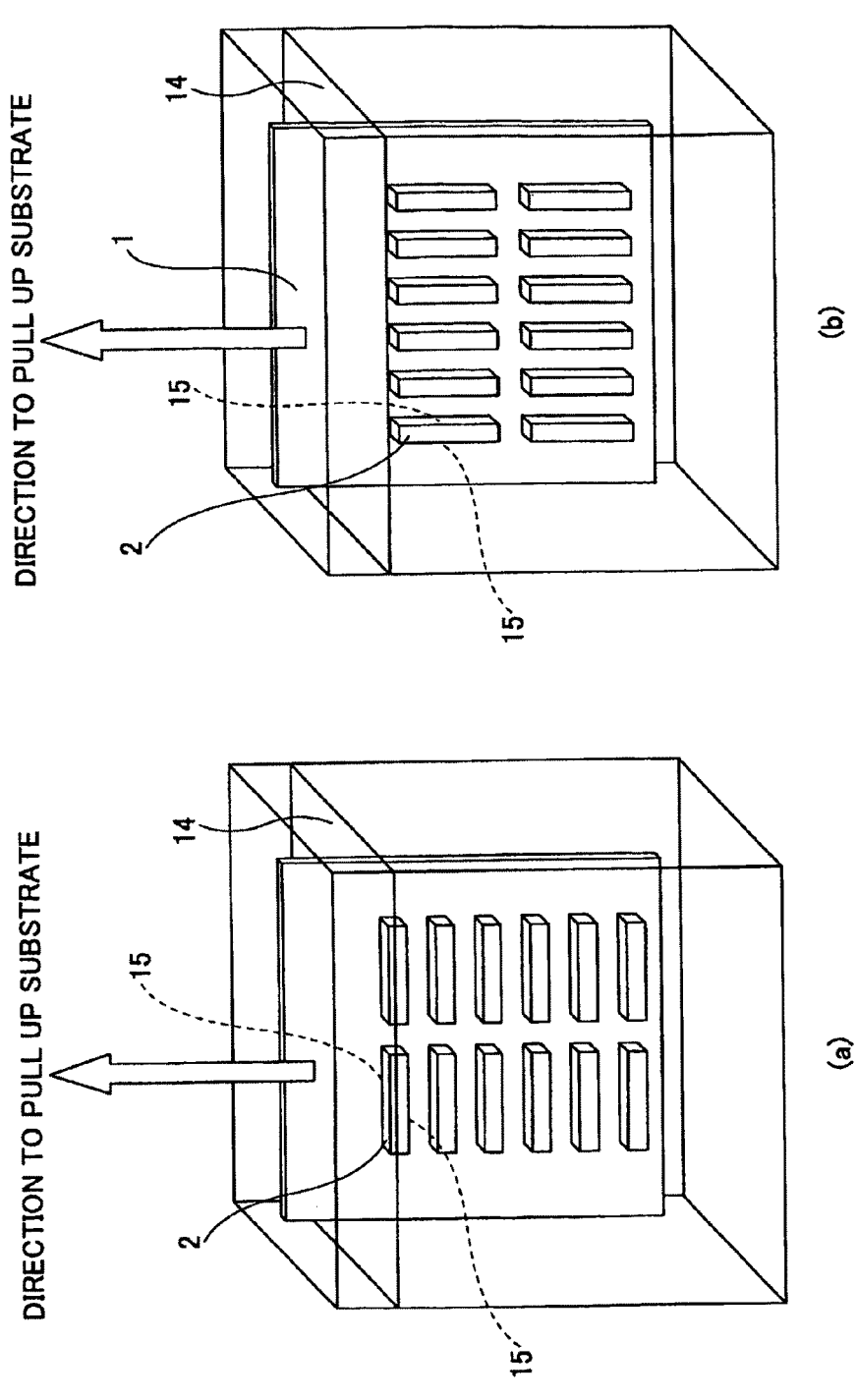
FIG. 3 is a schematic diagram showing an example of a dipping method used in the present invention.

FIG. 3, shows an example of the dipping method used in the present invention. In this case, a coating liquid 14 in which the insulating material is dissolved is coated onto the substrate 1 using the dipping method, the substrate 1 having the first electrode layers 2 formed and arrayed. As shown in FIG. 3, if the dipping method is used, when the substrate 1 is dipped into the coating liquid 14, the coating liquid 14 is uniformly brought into contact with a surface of the first electrode layer 2. In this case, by pulling up the substrate 1 in a direction shown in FIG. 3-(b), it is possible to form the insulating layer 3 on side walls 15 of the first electrode layer 2 in a more uniform manner, the side walls 15 corresponding to a first channel 12 and a second channel 13 (refer to FIG. 1).

In the present invention, preferably, the insulating layer 3 is made of an insulating material which becomes at least two areas of a high surface energy area 18 having a high critical surface tension and a low surface energy area having a low critical surface tension when energy is applied thereto. And at least one of the second electrode layer 6, third electrode layer 7, and conductive layer 5 is preferably made of a coatable material. In accordance with this, it is possible to perform high resolution patterning on the insulating layer 3. Preferably, a difference of the surface energy between the two areas is not less than 10 mN/m in order to securely attach a liquid 19 containing the conductive material in accordance with pattern shapes in the high surface energy area 18 and the low surface energy area.

Figure 4:
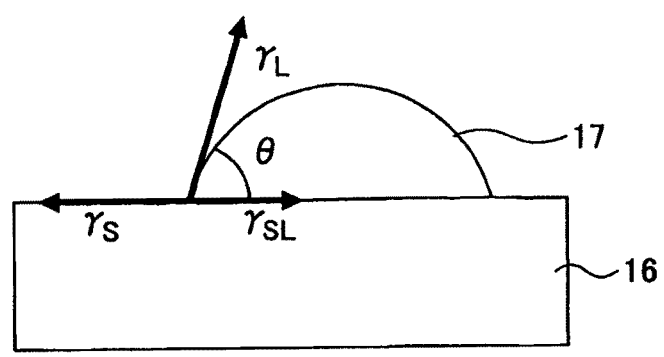
FIG. 4 is schematic diagram showing a droplet in equilibrium on a surface of a solid substance with a contact angle θ.

In the present invention, the critical surface tension is defined as follows. FIG. 4 shows a droplet 17 in equilibrium on a surface of a solid substance 16 with a contact angle θ. This is represented by Young's equation:

$$\gamma_S = \gamma_{SL} + \gamma_L \cos\theta$$

In this equation, $\gamma_S$ indicates surface tension of a solid substance 16, $\gamma_{SL}$ indicates interfacial tension of the solid substance 16 and the droplet 17, and $\gamma_L$ indicates surface tension of the droplet 17. The meaning of the surface tension is practically the same as that of surface energy and has the same value. When $\cos\theta=1$, $\theta=0°$ and the surface of the solid substance 16 is completely wet with the droplet 17. In this case, a value of $\gamma_L$ is $\gamma_S - \gamma_{SL}$ and this is referred to as the critical surface tension $\gamma_C$ of the solid substance 16. $\gamma_C$ is represented by plotting a relationship between the surface tension of the droplet 17 and the contact angle (Zisman plot) with the use of several types of liquid whose surface tension is known and obtaining a surface tension in which $\theta=0°$ ($\cos\theta=1$). When $\gamma_C$ is large, the surface of the solid substance 16 is readily wet with the liquid (lyophilic) and when $\gamma_C$ is small, the surface of the solid substance 16 is not readily wet with the liquid (lyophobic).

Figure 5:
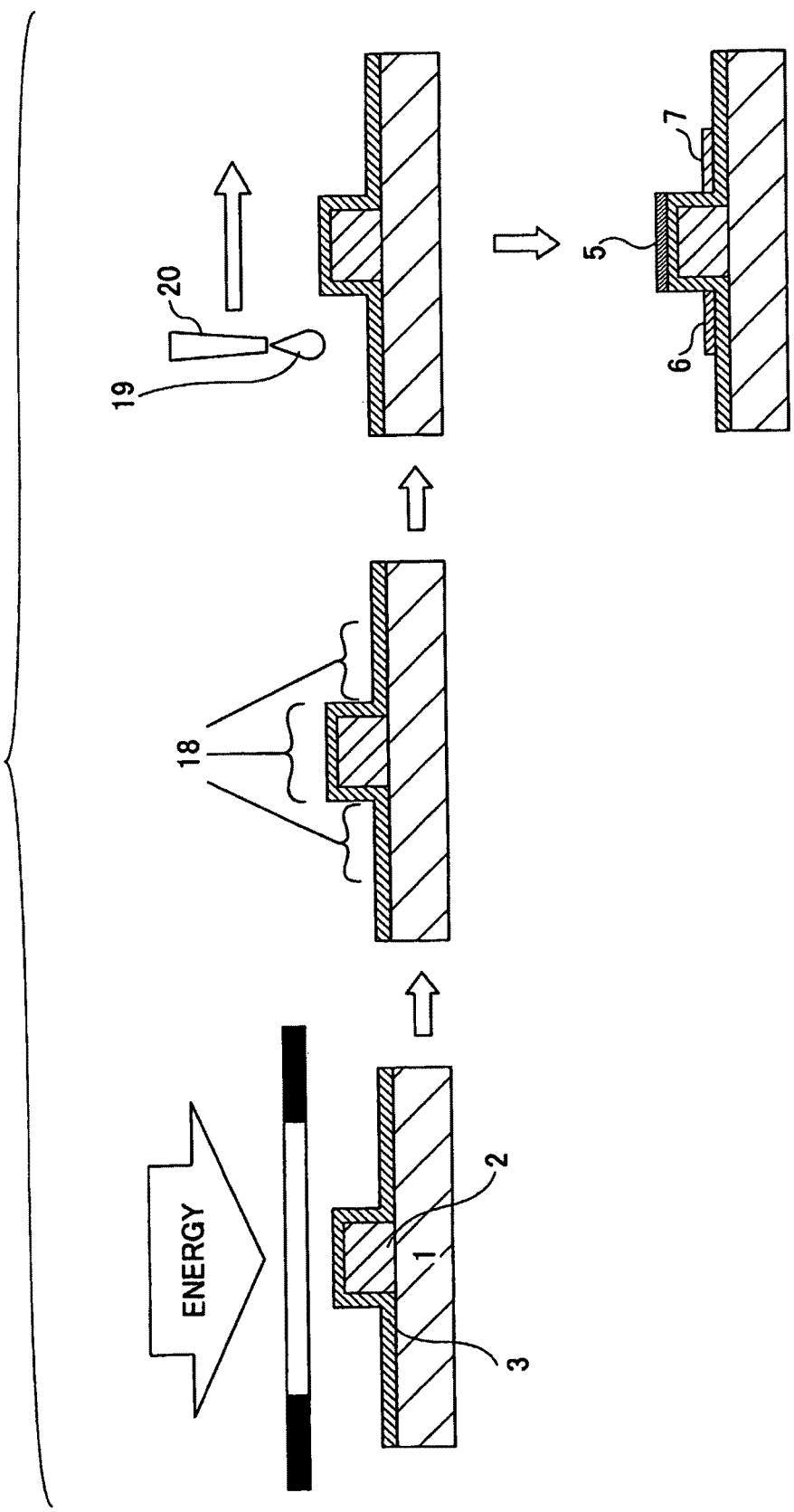
FIG. 5 is a schematic diagram showing an example of a method for manufacturing an electronic element according to the present invention.

FIG. 5 shows an example of a method for manufacturing the electronic element according to the present invention. In this case, energy is applied to a surface of the insulating layer 3 having the low surface energy area so as to locally have the high surface energy area 18. Then, the liquid 19 containing the conductive material is coated onto the high energy area from an ink-jet nozzle 20 using the ink-jet method. The energy is not readily applied to the side faces of the first electrode layer 2 and the side faces become the low surface energy areas, so that the conductive material is not readily attached. In accordance with this, it is possible to control the distance between the second electrode layer 6 and the conductive layer 5 and between the third electrode layer 7 and the conductive layer 5 using the film thickness of the first electrode layer 2.

In the present invention, preferably, the critical surface tension of the low surface energy area is not more than 40 mN/m. In accordance with this, it is possible to increase the mobility of the semiconductor layer 8. In addition, the low surface energy area is sufficiently lyophobic, so that it is possible to perform preferable patterning on the insulating layer 3.

Figure 6:
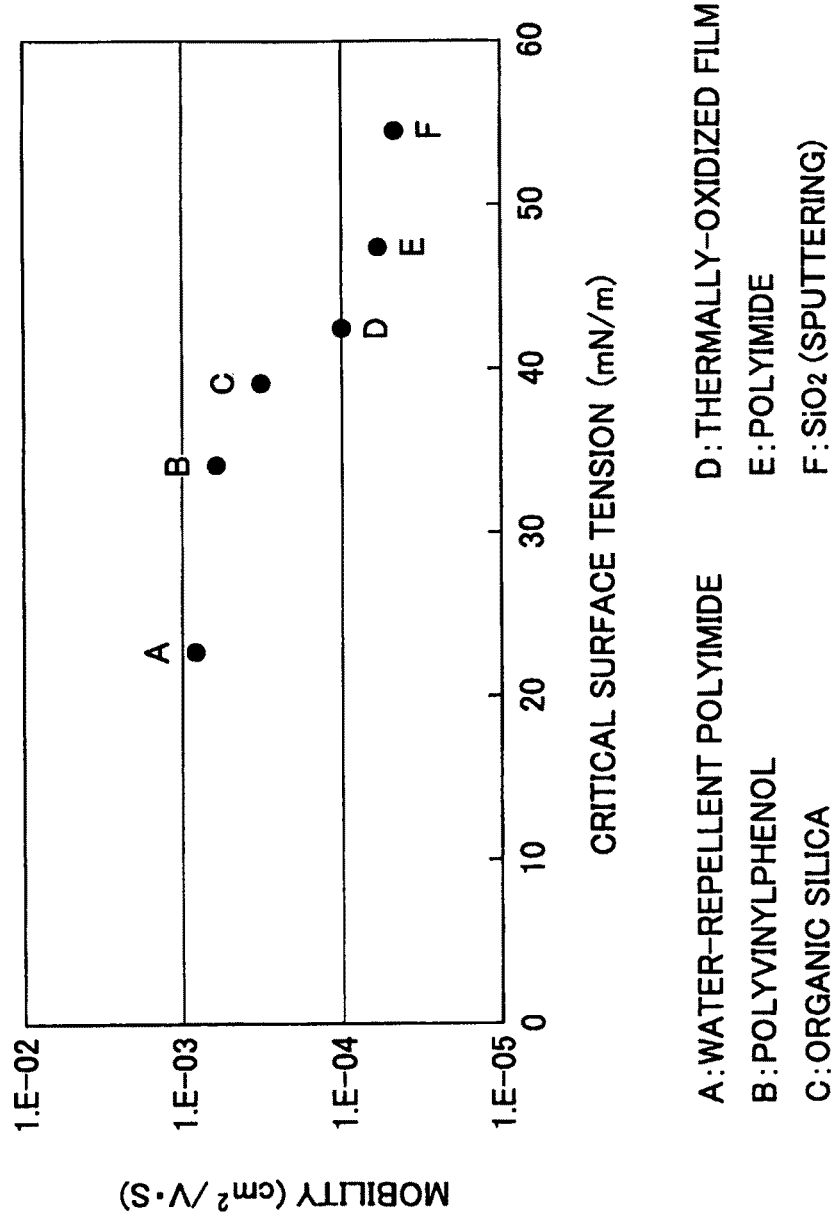
FIG. 6 is a diagram showing a relationship between mobility of a semiconductor layer and critical surface tension of an insulating layer.
Figure 21:
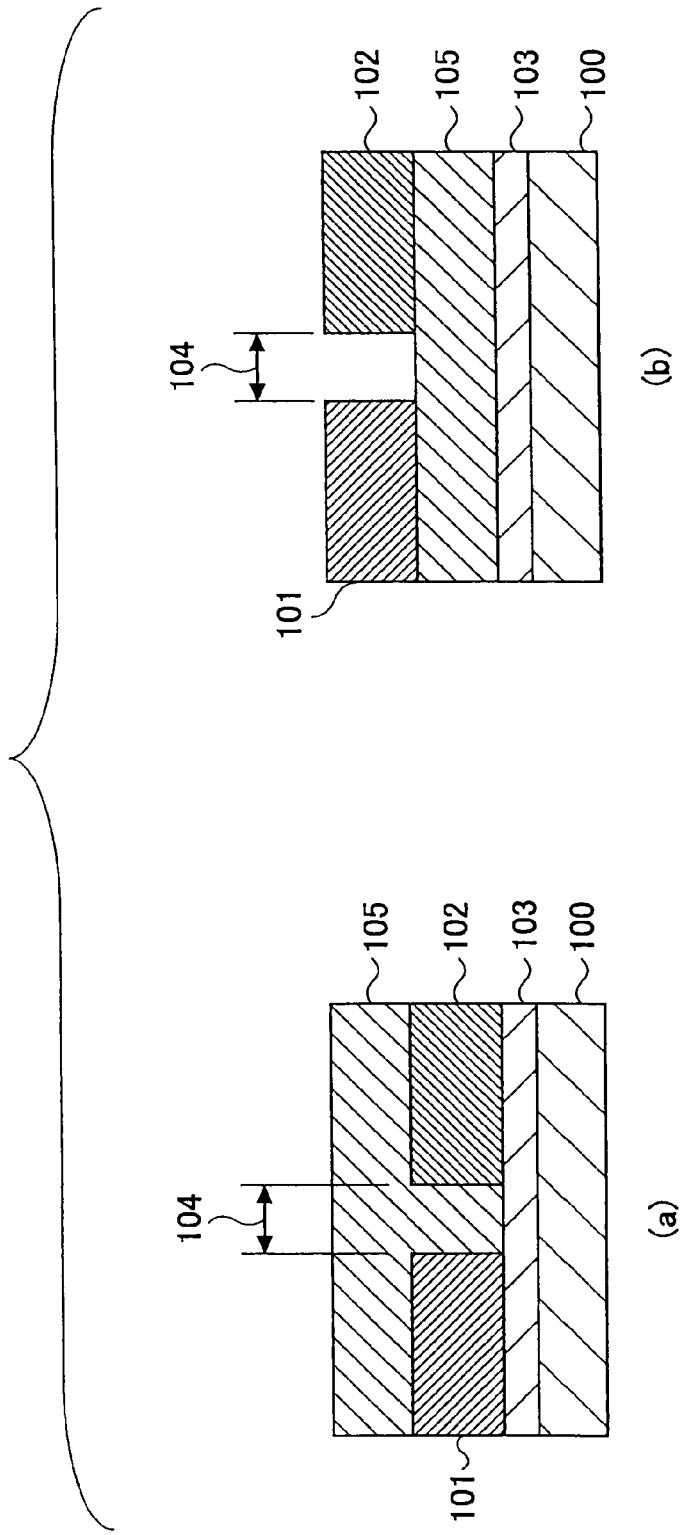
FIG. 21 is a diagram showing a general structure of a transistor.
Figure 22:
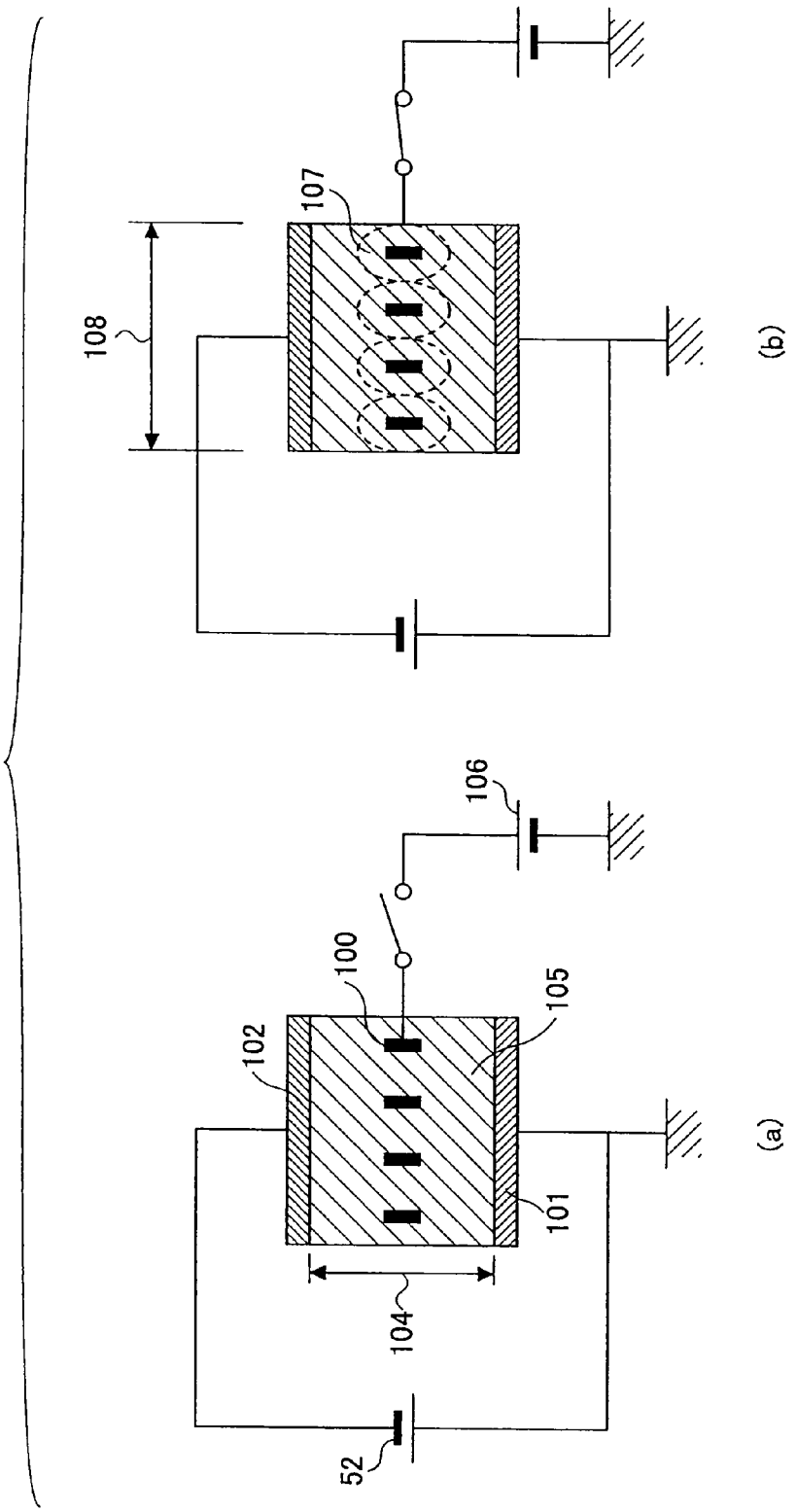
FIG. 22 is a diagram showing a general structure of an active element having an SIT structure.

FIG. 6 shows a relationship between the mobility of the semiconductor layer 8 and the critical surface tension of the insulating layer 3. A plot shown in FIG. 6 is obtained by preparing the transistor shown in FIG. 21-(a), using an organic semiconductor material represented by structural formula (1) below and insulating materials A to F shown in FIG. 6, and measuring the mobility of the semiconductor layer 8 and the critical surface tension of the insulating layer 3. From FIG. 6, the mobility of the semiconductor layer 8 is increased when the critical surface tension is not more than 40 mN/m.

Structural formula (1):

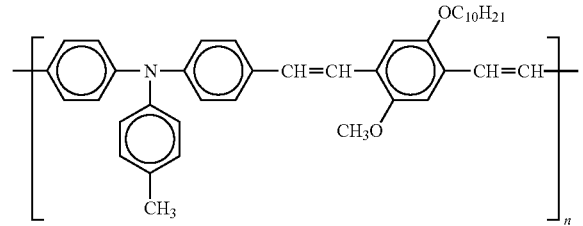

In the present invention, preferably, the insulating layer 3 is made of at least a first material 21 and a second material 22 in which the first material 21 has a larger change of the critical surface tension when energy is applied in comparison with the second material 22 and the second material 22 has a function other than changing the critical surface tension. In accordance with this, it is possible to securely develop a function for changing the critical surface tension. In other words, it is possible to increase the difference of the critical surface tension between the high surface energy area 18 and the low surface energy area formed when energy is applied and to perform high resolution patterning on the insulating layer 3. Preferably, the insulating layer 3 has distribution of a component ratio of materials in a direction of a film thickness and concentration of the first material 21 on the surface of the insulating layer 3 is higher than that of the second material 22. More preferably, the concentration of the first material 21 on the surface is 100%. Further, the volume resistivity of the second material 22 is preferably not less than $1\times10^{13}$ Ω·cm.

Figure 7:
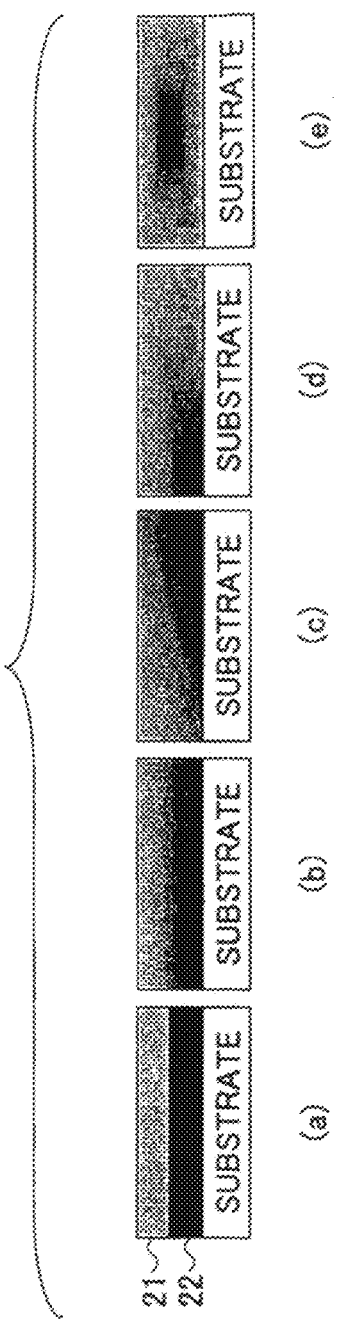
FIG. 7 is a cross-sectional view showing a layer changing a component ratio of materials in a direction of a film thickness.

FIG. 7 shows a layer changing the component ratio of materials in the film thickness direction. It is possible to prepare a structure of FIG. 7-(a) by forming a layer made of the second material 22 and a layer made of the first material 21 successively on the substrate 1. Examples of a preparation method include a vacuum process such as vacuum deposition and the like and a coating process using a solvent. It is possible to prepare a structure of FIG. 7-(b) by coating a solution in which the first material 21 and the second material 22 are mixed onto the substrate 1 and drying the substrate 1. This is due to the fact that, when a polarity of the first material 21 is smaller than that of the second material 22 or when molecular weight of the first material 21 is smaller than that of the second material 22, for example, the first material 21 is likely to be moved to a surface of the layer while the solvent is evaporated upon drying. When the coating process is used, the layer made of the first material 21 and the layer made of the second material 22 are not clearly separated with an interface in many cases. However, it is possible to apply the coating process to the present invention if the concentration of the first material 21 is higher than that of the second material 22. In addition, structures in FIG. 7-(a) to 7-(e) show the first material 21 and the second material 22 mixed in the film thickness direction in a predetermined distribution of concentration.

An insulating layer 3 constructed with more than two types of materials may have a lamination structure of more than two layers and more than two types of materials may be mixed in the film thickness direction in a predetermined distribution of concentration.

In the present invention, preferably, the insulating layer 3 contains a polyimide material and the first material 21 further preferably includes a polyimide material having a hydrophobic group on a side chain thereof. The polyimide material is superior in solvent resistance and heat resistance, so that upon forming the semiconductor layer 8 on the first material 21, it is possible to reduce swelling due to the solvent and generation of a crack resulting from a temperature change upon burning. Thus, it is possible to manufacture an electronic device with high reliability.

Examples of the polyimide material having a hydrophobic group on the side chain include those materials disclosed in Japanese Laid-Open Patent Application No. 2002-162630, Japanese Laid-Open Patent Application No. 2003-96034, Japanese Laid-Open Patent Application No. 2003-267982, and the like. Regarding tetracarboxylic acid dianhydride constituting a main chain skeleton of the hydrophobic group, it is possible to use various types of materials such as aliphatic materials, alicyclic materials, aromatic materials, and the like. Specific examples include pyromellitic dianhydride, cyclobutanetetracarboxylic acid dianhydride, butanetetracarboxylic acid dianhydride, and the like. In addition to the above-mentioned materials, it is possible to use those material disclosed in Japanese Laid-Open Patent Application No. 11-193345, Japanese Laid-Open Patent Application No. 11-193346, Japanese Laid-Open Patent Application No. 11-193347, and the like.

In the present invention, preferably, energy used upon changing the critical surface tension is ultraviolet rays. In accordance with this, it is possible to perform operation in the air, obtain high resolution, and reduce damage in the insulating layer 3.

In the present invention, preferably, at least one of the second electrode layer 6, the third electrode layer 7, and the conductive layer 5 is made of more than one type of materials and a component ratio of more than one type of materials is preferably changed in the film thickness direction. In accordance with this, it is possible to readily control work function of the second electrode layer 6, the third electrode layer 7, and the conductive layer 5. When the second electrode layer 6, the third electrode layer 7, and the conductive layer 5 are made of the first material 21 and the second material 22, the layer shown in FIG. 7 is obtained.

In an area where the semiconductor layer 8, the second electrode layer 6, the third electrode layer 7, and the conductive layer 5 are brought into contact, work function of the semiconductor material and the conductive material must be matched. In particular, when an n-type semiconductor material and a p-type semiconductor material are present on a single substrate at the same time, the following problems are generated in some cases. In other words, when the n-type semiconductor material is used, if the work function of the conductive material is larger than that of the semiconductor material, the injection of carriers from the conductive material to the semiconductor material is inhibited. By contrast, when the p-type semiconductor material is used, if the work function of the conductive material is smaller than that of the semiconductor material, the injection of carriers from the conductive material to the semiconductor material is inhibited. Thus, it is necessary to use more than one type of conductive materials so as not to inhibit the injection of carriers. Preferably, the second electrode layer 6, the third electrode layer 7, and the conductive layer 5 are formed, using conductive materials whose work function is larger than that of the p-type semiconductor material, and then a conductive material whose work function is smaller than that of the n-type semiconductor material is laminated on an area where the conductive material is in contact with the n-type semiconductor material so as not to inhibit the injection of carriers to the p-type semiconductor material.

In the present invention, when the semiconductor layer 8 is formed using the p-type semiconductor material, preferably, the surfaces of the second electrode layer 6, the third electrode layer 7, and the conductive layer 5 are formed with conductive materials having large work function such as Ag, Au, Pt, and the like. When the semiconductor layer 8 is formed using the n-type semiconductor material, preferably, the surfaces of the second electrode layer 6, the third electrode layer 7, and the conductive layer 5 are formed with conductive materials having small work function such as Mg, Al, Cr, and the like.

Figure 8:
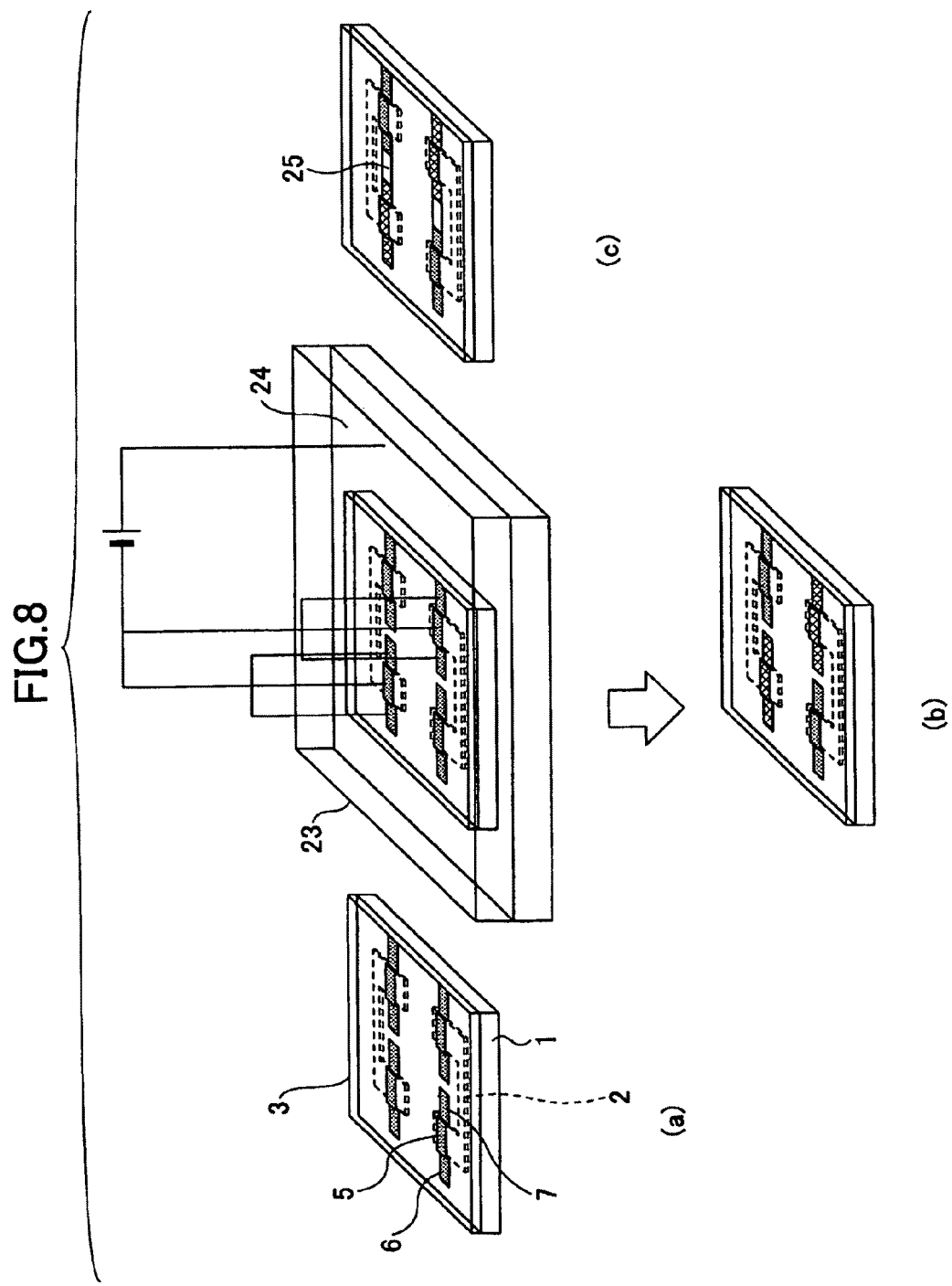
FIG. 8 is a schematic diagram showing electrolytic plating used in the present invention.

In the present invention, preferably, the surface of at least one of the second electrode layer 6, the third electrode layer 7, and the conductive layer 5 is electrolytically plated. By using the electrolytic plating, it is possible to selectively form the conductive materials on an area to which a voltage is applied. Thus, even when the substrate 1 is expanded or contracted, a highly accurate positioning process is not necessary, so that it is possible to employ a very simplified process. For example, when a Cr thin film is laminated on a desired position after an Au thin film is formed, it is possible to use a method shown in FIG. 8. This method is a manufacturing method in which four electronic elements are arranged and arrayed and each electronic element is wired. First, the second electrode layer, 6, the third electrode layer 7, and the conductive layer 5 are subjected to patterning using an Au nanoparticle dispersion by the ink-jet method (refer to FIG. 8-(a)). Next, only a portion where a layer whose work function is smaller than that of Au must be formed is connected to a cathode, the substrate 1 is dipped into a Cr electrolytic plating solution 24 in a plating bath 23, and a Cr thin film is formed on a desired position in a laminated manner (FIG. 8-(b)). Further, a wiring electrode 25 is formed between the electronic elements by patterning using an Ag nanoparticle dispersion by the ink-jet method (refer to FIG. 8-(c)).

An arithmetic device of the present invention has the electronic element or the current control device of the present invention. Thus, it is possible to manufacture an arithmetic device capable of high-speed response at a low cost.

Figure 9:
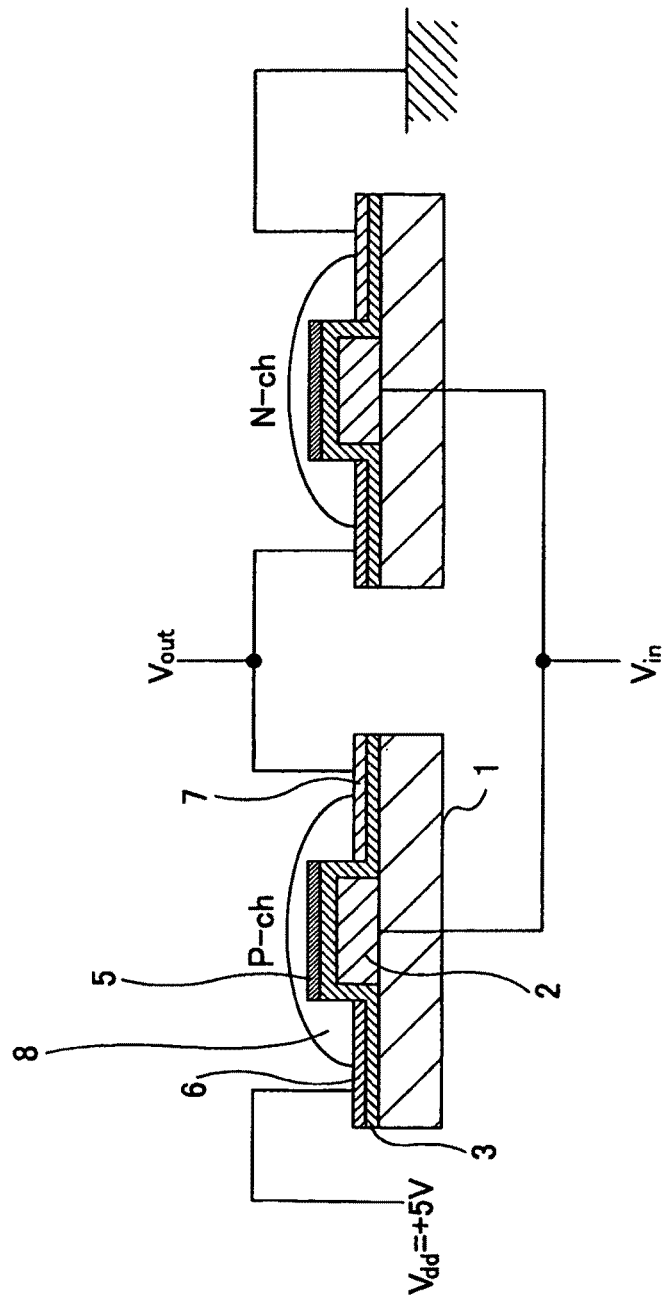
FIG. 9 is a schematic diagram showing an example of a structure of an arithmetic device according to the present invention.

FIG. 9 shows an example of a structure of the arithmetic device according to the present invention. P-ch and N-ch indicate a transistor in which a hole-transport material is used and a transistor in which an electron-transport material is used. In this case, when +5V is applied to $V_{in}$, N-ch is ON, P-ch is OFF, and $V_{out}$ is 0V. When $V_{in}$ is 0V, N-ch is OFF and $V_{dd}$ is +5V, so that a potential difference between a gate electrode and a source electrode of P-ch is 5V and +5V is output at $V_{out}$. In this manner, electric potential is reversed between $V_{in}$ and $V_{out}$, so that it is possible to use the circuit of FIG. 9 as an inverter circuit. Moreover, it is possible to manufacture a control device by combining the inverter circuit with an arithmetic circuit such as an AND circuit, a NAND circuit, a NOR circuit, and the like.

A first embodiment of a display device according to the present invention performs display based on a change of voltage between electrodes formed on one of two substrates disposed in an opposing manner, and the electronic element or the current control device according to the present invention is used for pixel switching. Thus, it is possible to manufacture a display device capable of high-speed response at a low cost. Examples of such a display device include a liquid crystal display device, an electrophoretic display device, a plasma display device, and the like.

Figure 10:
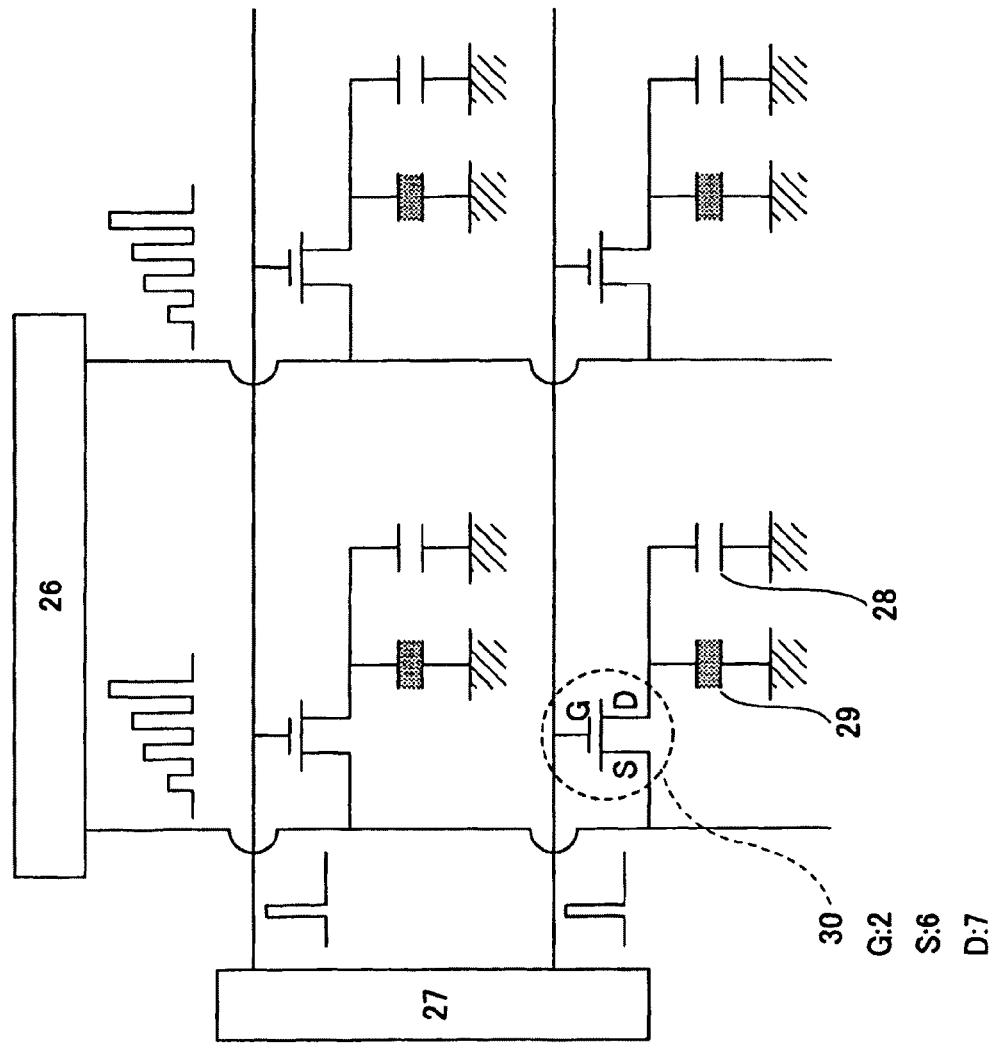
FIG. 10 is a schematic diagram showing an example of a liquid crystal display device.

FIG. 10 shows an example of a configuration of a liquid crystal display device including an active element 30. A voltage is applied from a gradation signal line 26 based on gradation of each pixel. An ON/OFF signal voltage is successively applied from a scanning line 27 per line. After scanning of a single screen is ended, scanning of the next screen is started. If video images are supported, preferably, this interval is not less than $50H_z$ (not more than $\frac{1}{50}$ second). A capacitor 28 has a function of charging a voltage of gradation signals for a period of time when moving from a certain screen to the scanning of the next screen and of applying the voltage to a liquid crystal cell 29.

A second embodiment of the display device according to the present invention performs display using an electric current between electrodes formed on one of two substrates disposed in an opposing manner, and the electronic element or the current control device according to the present invention is used for, pixel switching or pixel driving. Thus, it is possible to manufacture a display device capable of high-speed response at a low cost. Examples of such a display device include an EL display device, an electrochromic display device, an electrodeposition display device, and the like.

Figure 11:
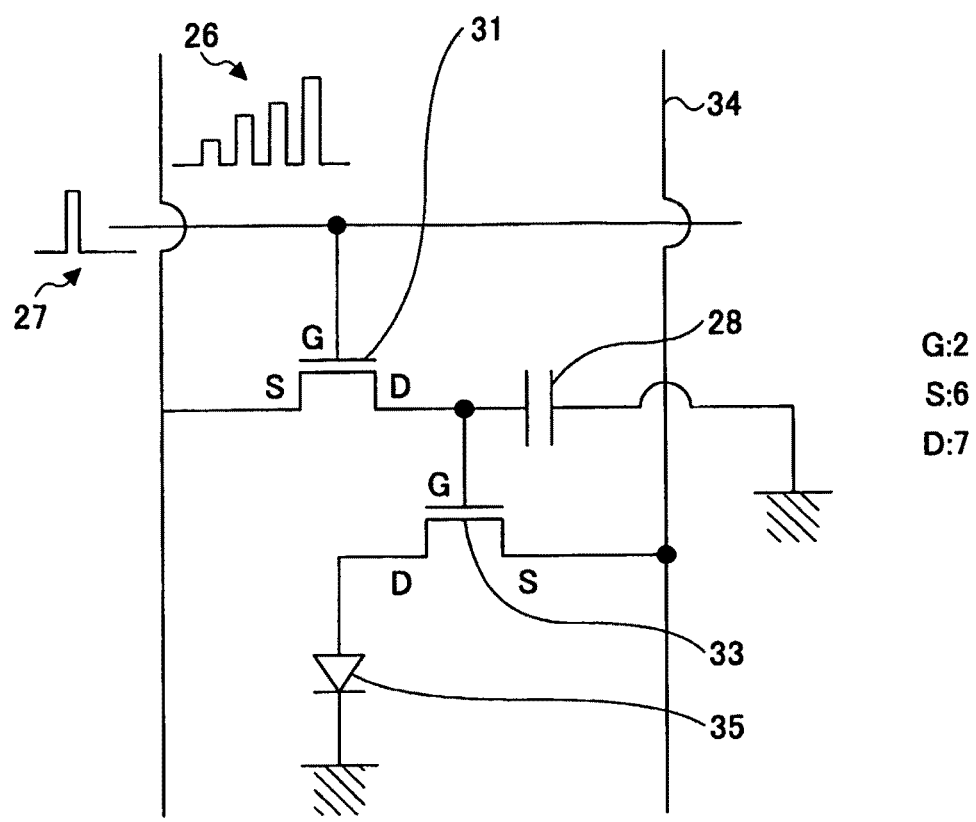
FIG. 11 is a schematic diagram showing an example of a structure of a single pixel in an EL display device.

FIG. 11 shows an example of a configuration of a single pixel in an EL display device. When a voltage is applied from a scanning line 27 to a pixel switching TFT 31, a capacitor is charged with electric charge, the voltage is applied to a first electrode G of a pixel driving TFT 33 and a current is supplied from a current supply line 34 to an EL element 35 and the EL element 35 emits light. The capacitor is charged with the electric charge for a period of time when moving from a certain screen to the scanning of the next screen, so that the pixel driving TFT 33 is ON and the EL element 35 continues to emit light.

Example 1

An electronic element having a configuration as shown in FIG. 1 is manufactured. Specifically, the first electrode layer 2 made of Al is formed on a glass substrate by patterning with a width of 50 μm through wet etching. Then, the insulating layer 3 made of parylene C is formed with a film thickness of 400 nm through CVD. Next, the second electrode layer 6 made of Au, the third electrode layer 7 made of Au, and the conductive layer 5 made of Au are formed through deposition. Further, the semiconductor layer 8 made of the organic semiconductor material (mobility: $1.2\times10^{-3}$ cm$^2$/V·s) represented by structural formula (1) is formed. A channel length (total length of the first channel 12 and the second channel 13) of an obtained electronic element is 1.9 μm.

Figure 12:
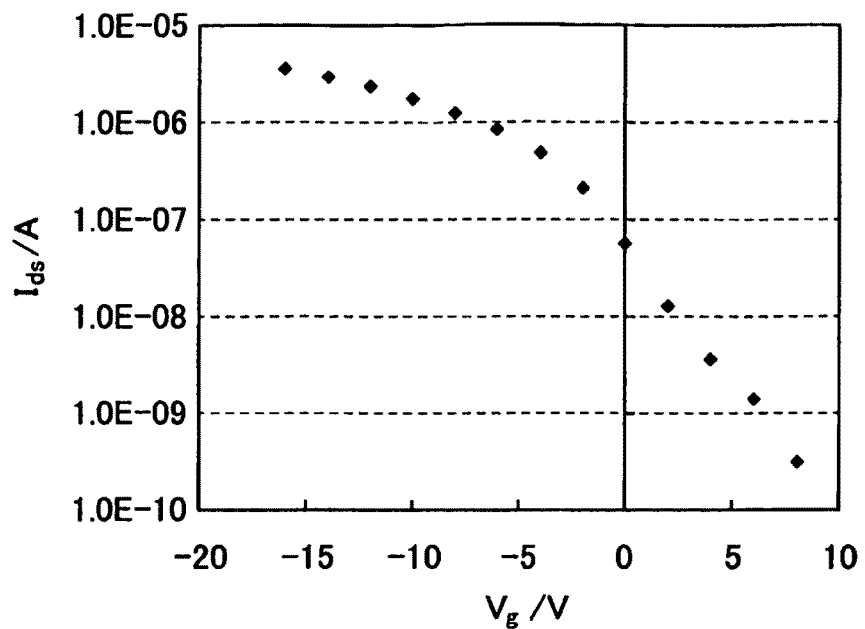
FIG. 12 is a diagram showing a result of evaluation of static characteristics in example 1.

Static characteristics are evaluated by measuring an electric current $I_{ds}$ flown when each voltage of the first voltage control device 10 and the second voltage control device 11 is applied, on the assumption that a voltage $V_g$ of the first voltage control device 10 ranges from +8 to −16V and a voltage $V_{ds}$ of the second voltage control device 11 is −16V. FIG. 12 shows a result the evaluation. From the figure, it is understood that $I_{ds}$ is $3.77\times10^{-6}$ A when $V_g=V_{ds}=-16V$, and an ON/OFF ratio is obtained in the order of four digits when $V_g$ ranges from +8 to −16V.

Figure 13:
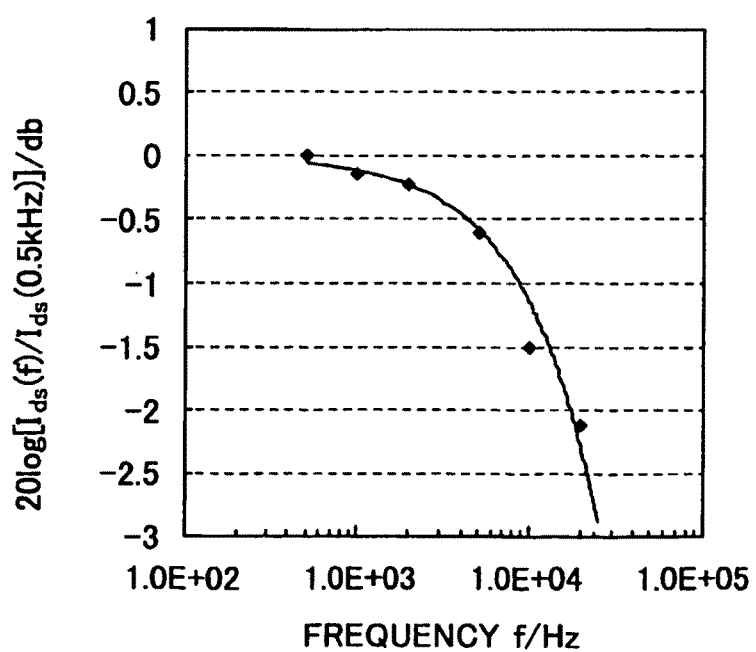
FIG. 13 is a diagram showing a result of evaluation of dynamic characteristics in example 1.

Dynamic characteristics are evaluated by measuring the electric current $I_{ds}$ flown when each voltage is applied, on the assumption that $V_g$ ranges from +6 to −10V (sine wave), $V_{ds}$ is −8V, and frequency of the first voltage control device 10 ranges from 0.5 to 50 kHz. It is also assumed that a gain obtained when the frequency is 0.5 kHz is 1 and the frequency when the gain is −3 db is cutoff frequency. FIG. 13 shows a result of the evaluation. From the figure, it is understood that cutoff frequency not less than 25 kHz is obtained. In this evaluation, the cutoff frequency $f_c$ calculated from each parameter is estimated to be about 40 kHz from the above-mentioned formula (1): $f_c=\mu V_{ds}/2\pi L^2$ on the assumption that the gate electrode (first electrode layer 2) is not overlapped with other electrode. Thus, although the conductive layer 5 and the first electrode layer 2 are overlapped as much as 50 μm in the actual device, it is possible to obtain a value of the cutoff frequency $f_c$ close to a case where the first electrode layer 2 and other electrode layer are not overlapped. In addition, the cutoff frequency $f_c$ when the electrode layers are overlapped is represented by a formula: $f_c=\mu V_{ds}/2\ \pi L\ (D+L)$, where D indicates a width of overlap. As D is increased, the parasitic capacity becomes larger.

Example 2

An electronic element is manufactured in the same manner as in Example 1 except that the insulating layer 3 is made of a polyimide material X491 (Chisso Corp.) and the second electrode layer 6, the third electrode layer 7, and the conductive layer 5 are formed using the process in FIG. 5.

In the following, the above-mentioned process is specifically described. Ultraviolet rays with irradiation energy of 9 J/cm$^2$ at a wavelength of 250 nm are irradiated onto the insulating layer 3 using an exposure mask having a form corresponding to the second electrode layer 6, the third electrode layer 7, and the conductive layer 5. Then, the second electrode layer 6 made of Ag, the third electrode layer 7 made of Ag, and the conductive layer 5 made of Ag are formed using an Ag nanoparticle dispersion (Sumitomo Electric Industries, Ltd.). Thereafter, etching is performed by dipping into a commercially available Ag etchant. A channel length (total length of the first channel 12 and the second channel 13) of an obtained electronic element is 2.7 μm.

Figure 14:
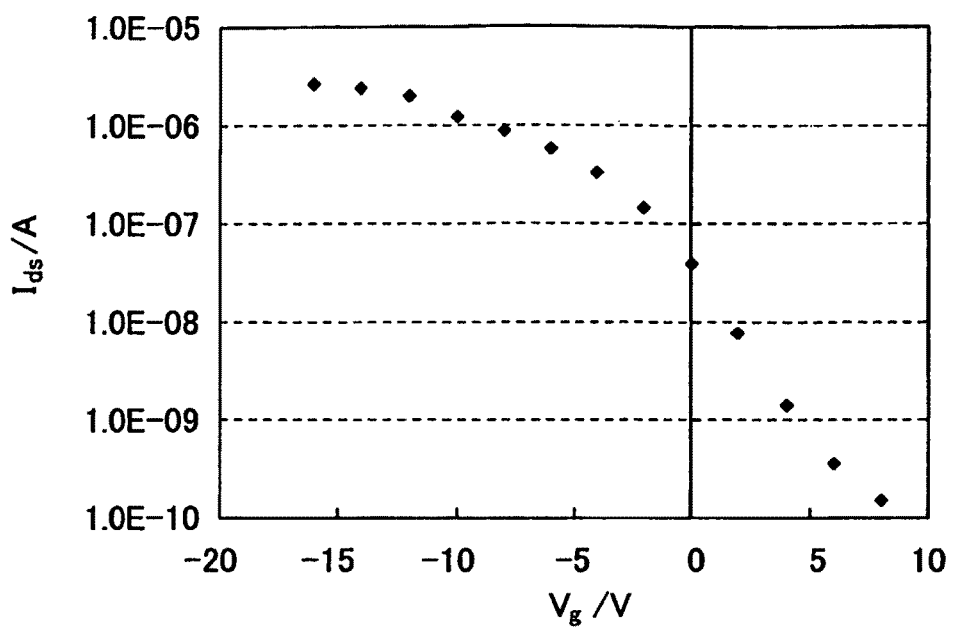
FIG. 14 is a diagram showing a result of evaluation of static characteristics in example 2.

Static characteristics are evaluated in the same manner as in Example 1. FIG. 14 shows a result the evaluation.

Example 3

An electronic element having a configuration as shown in FIG. 1 is manufactured. Specifically, the first electrode layer 2 made of Al is formed on a glass substrate by patterning with a width of 9 μm through wet etching. Then, the insulating layer 3 made of parylene C is formed with a film thickness of 370 nm through CVD. Next, the second electrode layer 6 made of Au, the third electrode layer 7 made of Au, and the conductive layer 5 made of Au are formed through deposition. Further, the semiconductor layer 8 made of pentacene (mobility: $4.5 \times 10^{-2}$ cm$^2$/V·s) is formed. A channel length (total length of the first channel 12 and the second channel 13) of an obtained electronic element is 2.95 μm.

Figure 15:
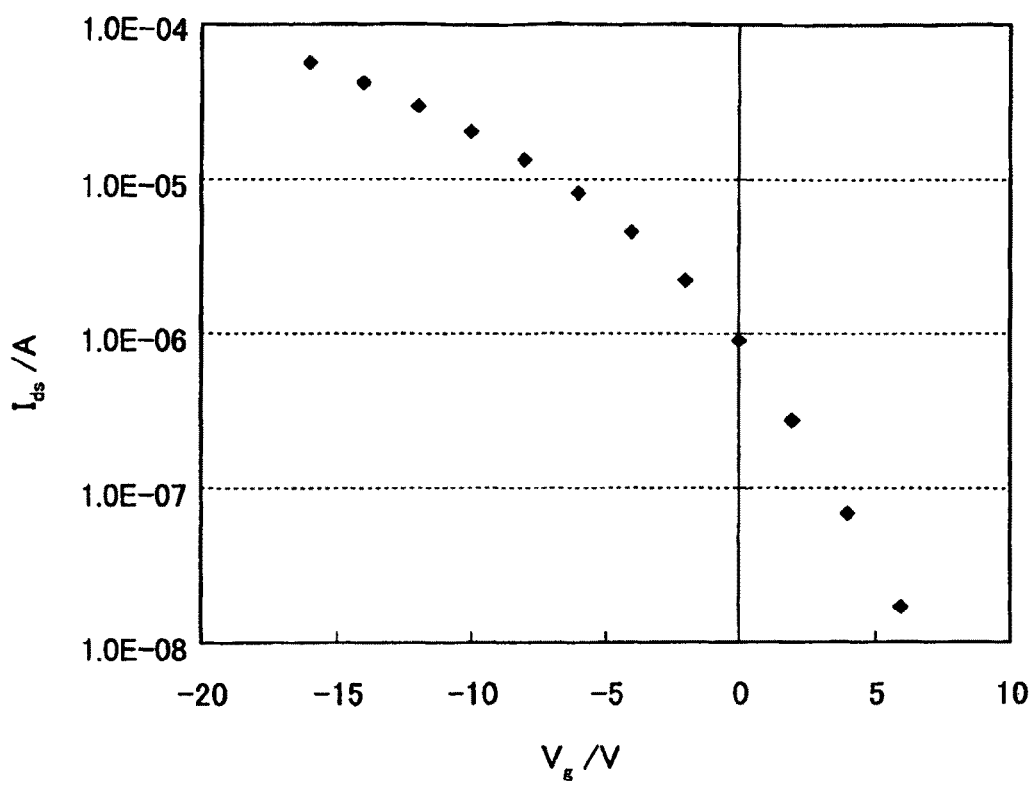
FIG. 15 is a diagram showing a result of evaluation of static characteristics in example 3.

Static characteristics are evaluated by measuring an electric current $I_{ds}$ flown when each voltage of the first voltage control device 10 and the second voltage control device 11 is applied, on the assumption that a voltage $V_g$ of the first voltage control device 10 ranges from +6 to −16V and a voltage $V_{ds}$ of the second voltage control device 11 is −16V. FIG. 15 shows a result the evaluation. From the figure, it is understood that $I_{ds}$ is $5.68 \times 10^{-5}$ A when $V_g=V_{ds}=-16$V, and an ON/OFF ratio is obtained in the order of four digits when $V_g$ ranges from +6 to −16V.

Figure 16:
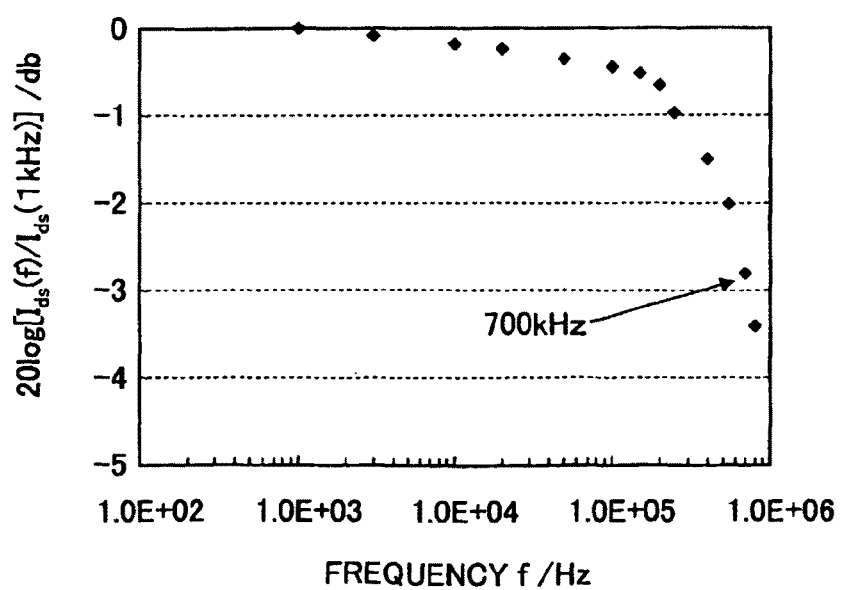
FIG. 16 is a diagram showing a result of evaluation of dynamic characteristics in example 3.

Dynamic characteristics are evaluated by measuring the electric current $I_{ds}$ flown when each voltage is applied, on the assumption that $V_g$ ranges from −8 to −14V (sine wave), $V_{ds}$ is −15V, and frequency of the first voltage control device 10 ranges from 1 to 800 kHz. It is also assumed that a gain obtained when the frequency is 1 kHz is 1 and the frequency when the gain is −3 db is cutoff frequency. FIG. 16 shows a result of the evaluation. From the figure, it is understood that cutoff frequency not less than 700 kHz is obtained.

Reference Example 1

Figure 17:
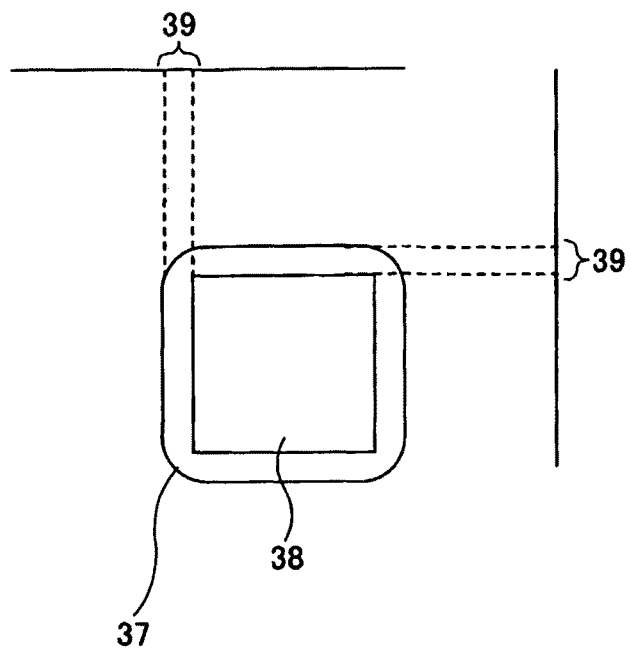
FIG. 17 is a diagram describing dot gain in reference example 1.

An electronic element is manufactured in the same manner as in Example 2 except that the second electrode layer 6, the third electrode layer 7, and the conductive layer 5 are formed by a screen printing method using a printing plate having substantially the same pattern as in the exposure mask in Example 2. In a comparison of a form of a pattern 37 after the layer made of Ag is formed and the pattern 38 of the exposure mask, dot gain 39 (refer to FIG. 17) is measured with an optical microscope and it is confirmed that the maximum dot gain is 6 μm.

Reference Example 2

Figure 18:
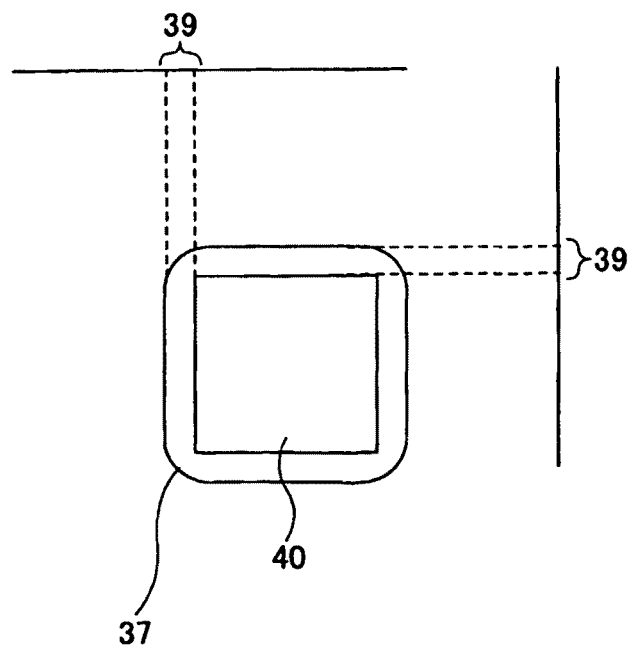
FIG. 18 is a diagram describing dot gain in reference example 2.

An electronic element is manufactured in the same manner as in Example 2 except that the second electrode layer 6, the third electrode layer 7, and the conductive layer 5 are formed using a screen printing plate having the same pattern as in the exposure mask in Example 2 without performing the UV irradiation. In a comparison of the form of a pattern 37 after the layer made of Ag is formed and the pattern 40 of the screen printing plate, dot gain 39 (refer to FIG. 18) is measured with an optical microscope and it is confirmed that the maximum dot gain is 20 μm.

The present invention is not limited to the specifically disclosed embodiment, and variations and modifications may be made without departing from the scope of the present invention.

The present application is based on Japanese priority application No. 2006-014996 filed Jan. 24, 2006, Japanese priority application No. 2006-132706 filed May 11, 2006, and Japanese priority application No. 2006-212249 filed Aug. 3, 2006, the entire contents of which are hereby incorporated herein by reference.

The invention claimed is:

1. An electronic element comprising:
    a substrate;
    a first electrode layer formed on a portion of the substrate;
    an insulating layer formed on the first electrode layer;
    a conductive layer where a voltage control device for applying a voltage is not disposed thereon, the conductive layer being formed on the insulating layer formed on an area where the first electrode layer is formed;
    a second electrode layer formed on one area where the first electrode layer on the substrate is not formed;
    a third electrode layer formed on the other area where neither the first electrode layer on the substrate nor the second electrode layer is formed;
    a semiconductor layer formed so as to cover between the conductive layer and the second electrode layer and to cover between the conductive layer and the third electrode layer;
    a first voltage control device for applying a voltage to the first electrode layer; and
    a second voltage control device for applying a voltage to the second electrode layer and the third electrode layer,
    wherein a direction of carriers upon applying the voltage using the second voltage control device is regulated such that the carriers are directed from the second electrode layer to the third electrode layer via the conductive layer where the voltage control device is not disposed thereon.

2. The electronic element according to claim 1, wherein said second electrode layer, said third electrode layer, and said conductive layer are made of the same material.

3. The electronic element according to claim 1, wherein at least one of said semiconductor layer and said insulating layer is formed by coating.

4. The electronic element according to claim 1, wherein said insulating layer is formed using a dipping method.

5. The electronic element according to claim 1, wherein said insulating layer is made of an insulating material whose critical surface tension is changed when energy is applied thereto.

6. A display device for performing display in accordance with a change of current between electrodes formed on one of two substrates disposed in an opposing manner, the display device comprising:
    an electronic element used for pixel switching or pixel driving, including:
    a substrate;
    a first electrode layer formed on a portion of the substrate;
    an insulating layer formed on the first electrode layer;
    a conductive layer where a voltage control device for applying a voltage is not disposed thereon, the conductive layer being formed on the insulating layer formed on an area where the first electrode layer is formed;
    a second electrode layer formed on one area where the first electrode layer on the substrate is not formed;
    a third electrode layer formed on the other area where neither the first electrode layer on the substrate nor the second electrode layer is formed;

a semiconductor layer formed so as to cover between the conductive layer and the second electrode layer and to cover between the conductive layer and the third electrode layer;

a first voltage control device for applying a voltage to the first electrode layer; and a second voltage control device for applying a voltage to the second electrode layer and the third electrode layer, wherein a direction of carriers upon applying the voltage using the second voltage control device is regulated such that the carriers are directed from the second electrode layer to the third electrode layer via the conductive layer where the voltage control device is not disposed thereon.

7. The display device according to claim 6, wherein in the electronic element, said second electrode layer, said third electrode layer, and said conductive layer are made of the same material.

8. The display device according to claim 6, wherein in the electronic element, at least one of said semiconductor layer and said insulating layer is formed by coating.

9. The display device according to claim 6, wherein in the electronic element, said insulating layer is formed using a dipping method.

10. The display device according to claim 6, wherein in the electronic element, said insulating layer is made of an insulating material whose critical surface tension is changed when energy is applied thereto.

11. An electronic element comprising:

a substrate;

a first electrode layer formed on a portion of the substrate;

an insulating layer formed on the first electrode layer;

a semiconductor layer formed so as to cover the first electrode layer on which the insulating layer is formed;

a conductive layer where a voltage control device for applying a voltage is not disposed thereon, the conductive layer being formed on the insulating layer formed on an area where the first electrode layer is formed;

a second electrode layer formed on one area where the first electrode layer on the substrate is not formed;

a third electrode layer formed on another area where neither the first electrode layer on the substrate nor the second electrode layer is formed;

a first voltage control device for applying a voltage to the first electrode layer; and a second voltage control device for applying a voltage to the second electrode layer and the third electrode layer, wherein a direction of carriers upon applying the voltage using the second voltage control device is regulated such that the carriers are directed from the second electrode layer to the third electrode layer via the conductive layer where the voltage control device is not disposed thereon.

* * * * *